(12) United States Patent
Agawa et al.

(10) Patent No.: US 12,362,339 B2
(45) Date of Patent: Jul. 15, 2025

(54) SEMICONDUCTOR DEVICE

(71) Applicants: KABUSHIKI KAISHA TOSHIBA, Tokyo (JP); Toshiba Electronic Devices & Storage Corporation, Tokyo (JP)

(72) Inventors: Kenichi Agawa, Yokohama (JP); Hidetoshi Miyahara, Kawasaki (JP); Yusuke Imaizumi, Kawasaki (JP); Atsushi Kurosu, Tokyo (JP); Atsushi Tomishima, Matsudo (JP); Jia Liu, Yokohama (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 537 days.

(21) Appl. No.: 17/654,276

(22) Filed: Mar. 10, 2022

(65) Prior Publication Data

US 2023/0089615 A1 Mar. 23, 2023

(30) Foreign Application Priority Data

Sep. 22, 2021 (JP) ................. 2021-154689

(51) Int. Cl.
*H01L 23/498* (2006.01)
*H01L 23/00* (2006.01)
(Continued)

(52) U.S. Cl.
CPC ........ *H01L 25/16* (2013.01); *H01L 23/49805* (2013.01); *H01L 23/49838* (2013.01);
(Continued)

(58) Field of Classification Search
CPC ............... H01L 25/16; H01L 23/49805; H01L 23/49838; H01L 23/5386; H01L 23/552;
(Continued)

(56) References Cited

U.S. PATENT DOCUMENTS 9,240,366 B2 1/2016 Jin et al.
2009/0212416 A1 8/2009 Skeete
(Continued)

FOREIGN PATENT DOCUMENTS

JP S58-87852 A 5/1983
JP 62-245663 A 10/1987
(Continued)

OTHER PUBLICATIONS

Japanese Office Action mailed Jul. 23, 2024 in corresponding Japanese Patent Application 2021-154689 (with English Translation), 6 pages.
(Continued)

*Primary Examiner* — Elias Ullah
(74) *Attorney, Agent, or Firm* — Kim & Stewart LLP

(57) ABSTRACT

According to one embodiment, a semiconductor device c includes: a package substrate including a base including a mount portion, and terminals; a semiconductor chip including a first pad to which a ground voltage is supplied, a second pad electrically connected to a first terminal among the terminals, and a semiconductor circuit connected to the first and second pads, the semiconductor chip being provided above the mount portion; and a first capacitor chip including a first capacitor unit provided in a silicon substrate, a first node supplied with the ground voltage, and a second node electrically connected to the second pad, the first capacitor chip being provided above the mount portion.

10 Claims, 25 Drawing Sheets

(51) Int. Cl.
  *H01L 23/538* (2006.01)
  *H01L 23/552* (2006.01)
  *H01L 25/16* (2023.01)

(52) U.S. Cl.
  CPC ........ *H01L 23/5386* (2013.01); *H01L 23/552* (2013.01); *H01L 24/16* (2013.01); *H01L 24/24* (2013.01); *H01L 24/32* (2013.01); *H01L 24/48* (2013.01); *H01L 24/73* (2013.01); *H01L 2224/16267* (2013.01); *H01L 2224/24265* (2013.01); *H01L 2224/32245* (2013.01); *H01L 2224/32267* (2013.01); *H01L 2224/48195* (2013.01); *H01L 2224/48245* (2013.01); *H01L 2224/48265* (2013.01); *H01L 2224/73204* (2013.01); *H01L 2224/73265* (2013.01); *H01L 2924/3025* (2013.01); *H01L 2924/3512* (2013.01)

(58) Field of Classification Search
  CPC ......... H01L 24/16; H01L 24/24; H01L 24/32; H01L 24/48; H01L 24/73; H01L 2224/16267; H01L 2224/24265; H01L 2224/32245; H01L 2224/32267; H01L 2224/48195; H01L 2224/48245; H01L 2224/48265; H01L 2224/73204; H01L 2224/73265; H01L 2924/3025; H01L 2924/3512; H01L 24/05; H01L 24/06; H01L 24/13; H01L 24/83; H01L 28/90; H01L 23/49575; H01L 23/49589; H01L 23/64; H01L 23/49827; H01L 23/50; H01G 4/228; H01G 4/40; H01G 2/065
  See application file for complete search history.

(56) References Cited

U.S. PATENT DOCUMENTS

| 2012/0068306 | A1 | 3/2012 | Song et al. |
| 2020/0066445 | A1 | 2/2020 | Nakagawa et al. |
| 2021/0391311 | A1* | 12/2021 | Rhodes ............... H01L 27/0883 |

FOREIGN PATENT DOCUMENTS

| JP | H03-24705 A | 2/1991 |
| JP | 2004-47811 A | 2/2004 |
| JP | 2006-041061 A | 2/2006 |
| JP | 2007-48962 A | 2/2007 |
| JP | 2011-513949 A | 4/2011 |
| JP | 2014-216645 A | 11/2014 |
| JP | 2015-19002 A | 1/2015 |
| WO | 2016076162 A1 | 5/2016 |
| WO | 2019021817 A1 | 1/2019 |

OTHER PUBLICATIONS

Decision to Grant dated Feb. 18, 2025 in related Japanese Patent Application 2021-154689 with English translation, 5 pages.

* cited by examiner

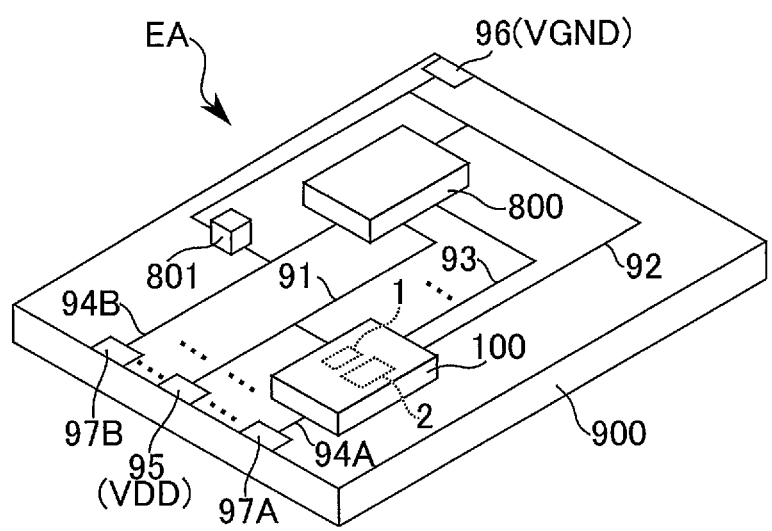
F I G. 1

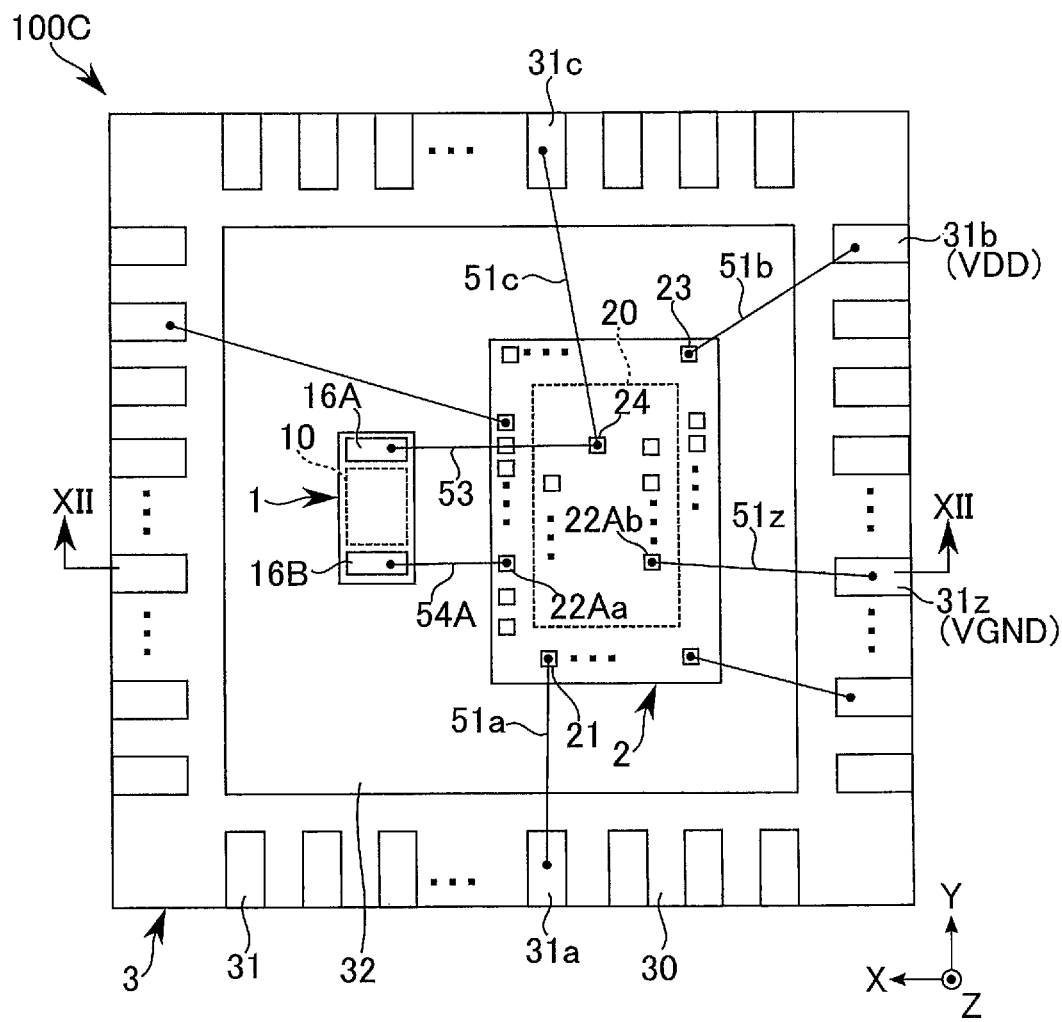
F I G. 11

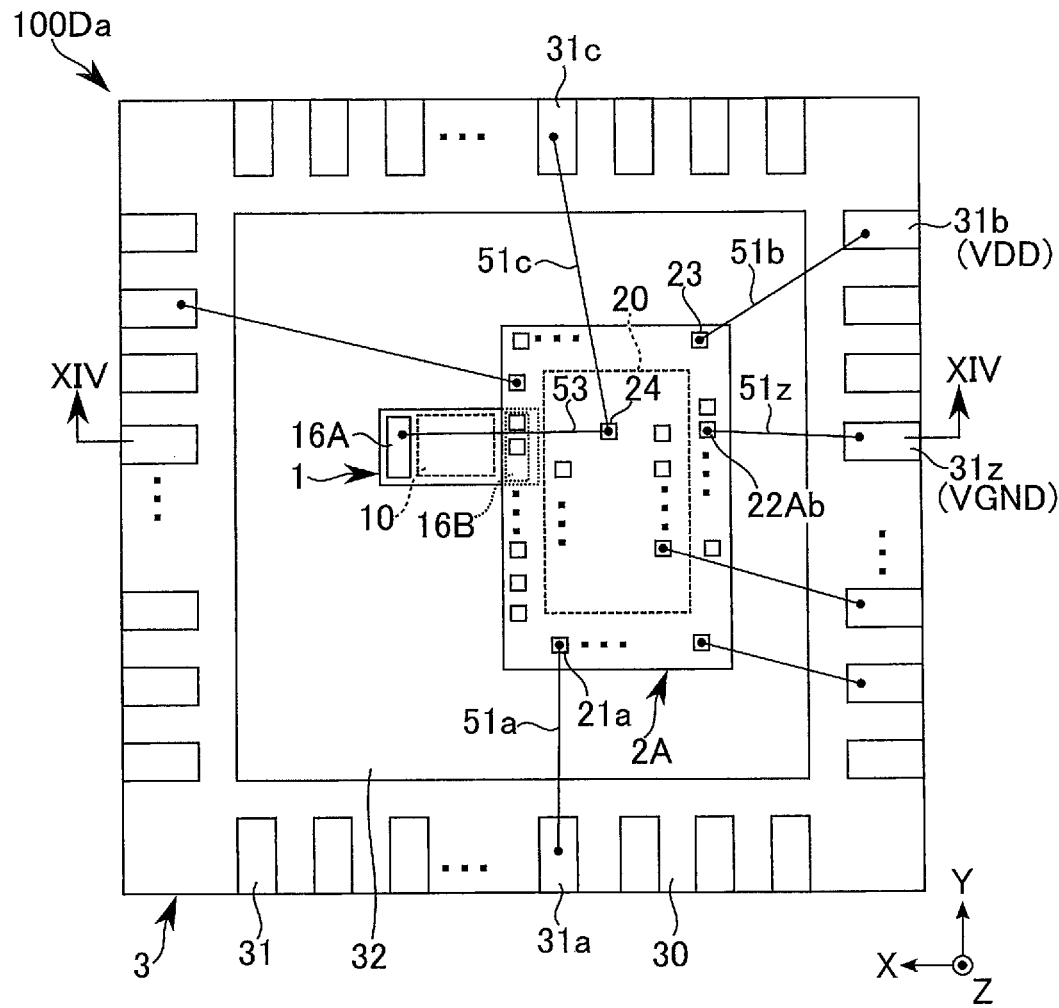
F I G. 13

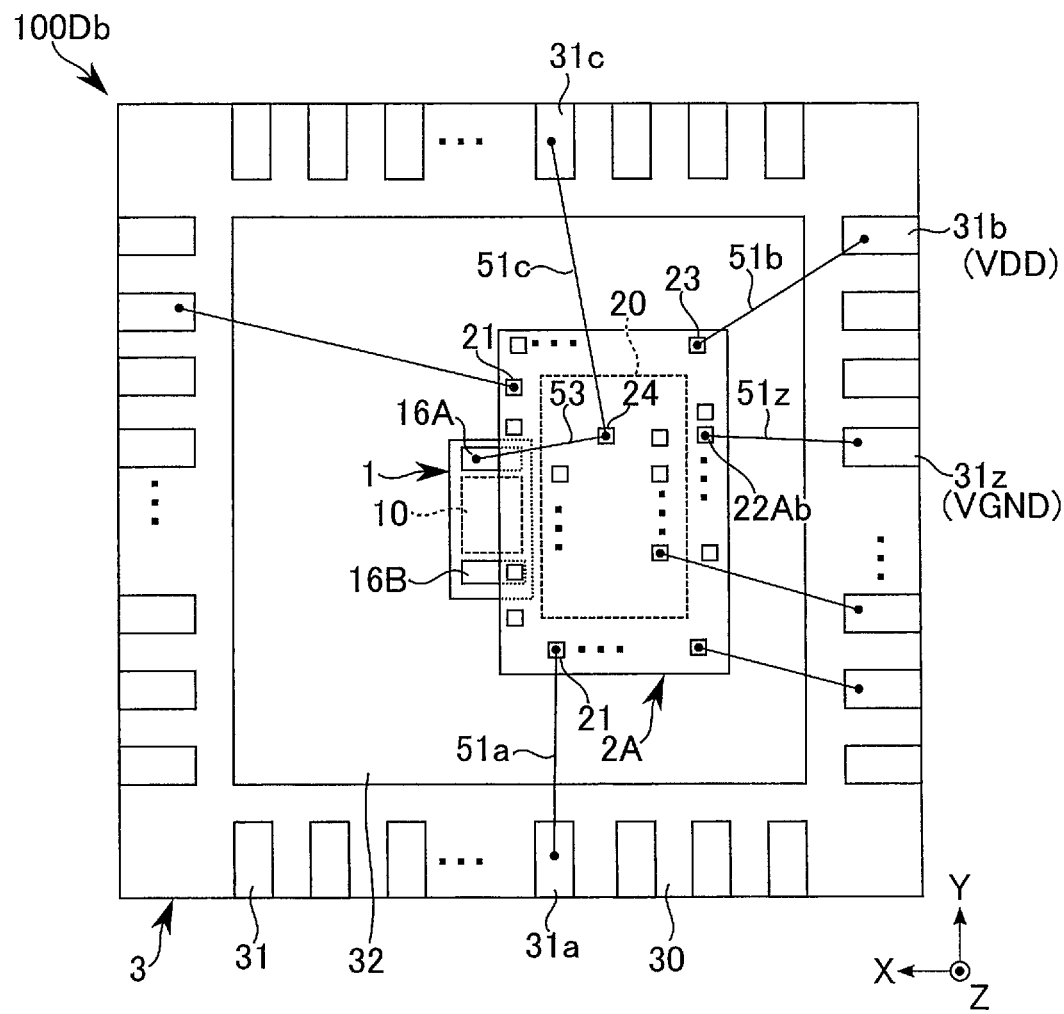
F I G. 15

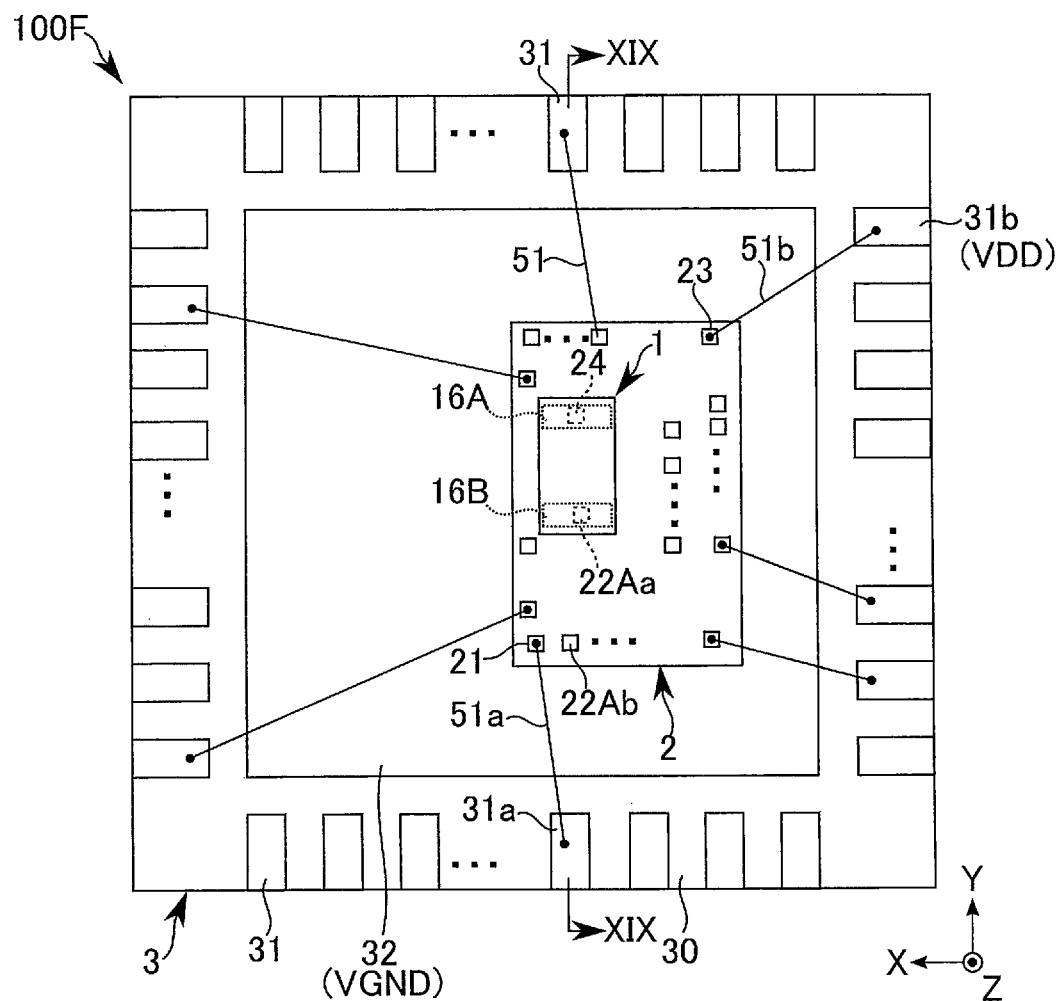
F I G. 18

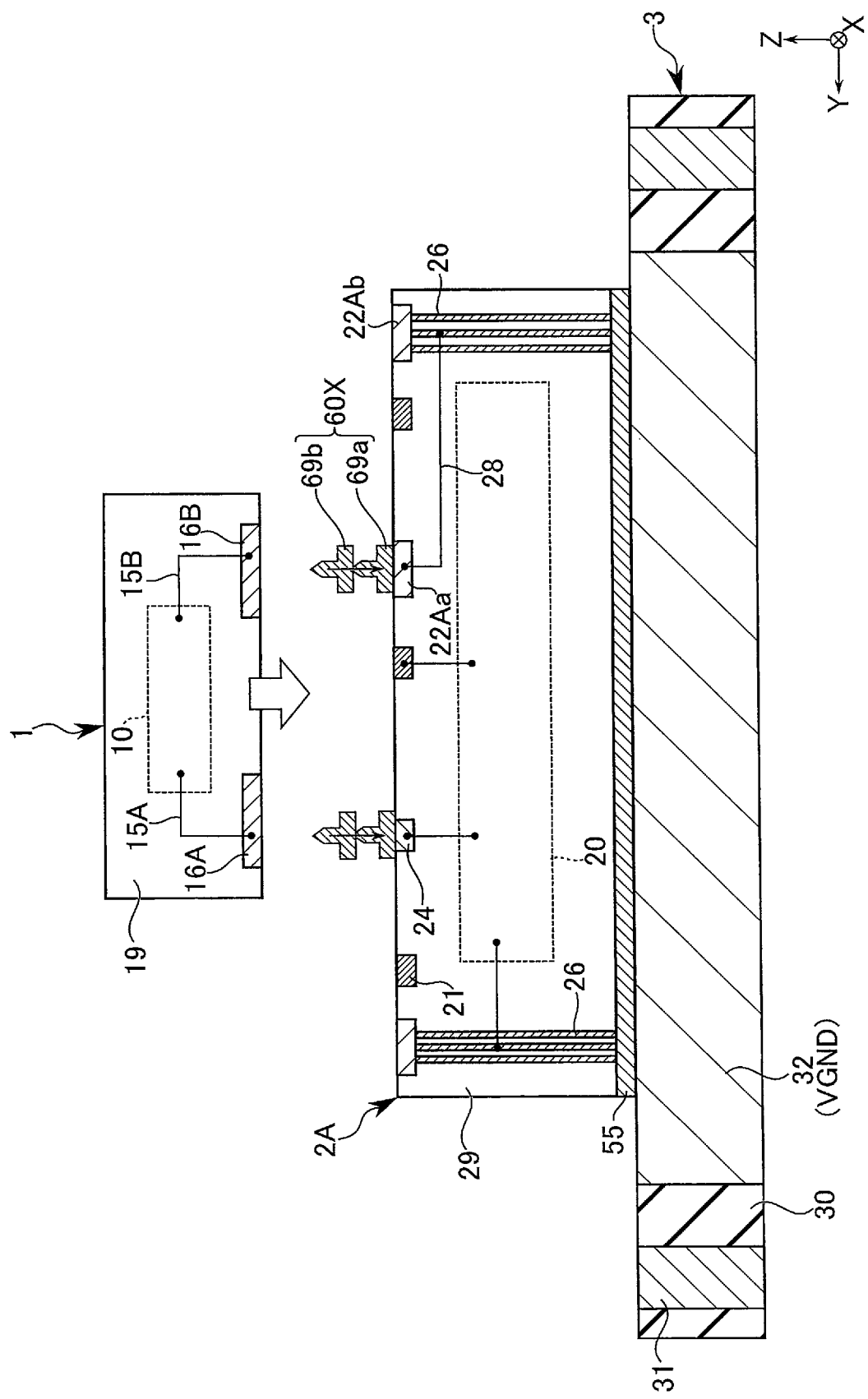
F I G. 20

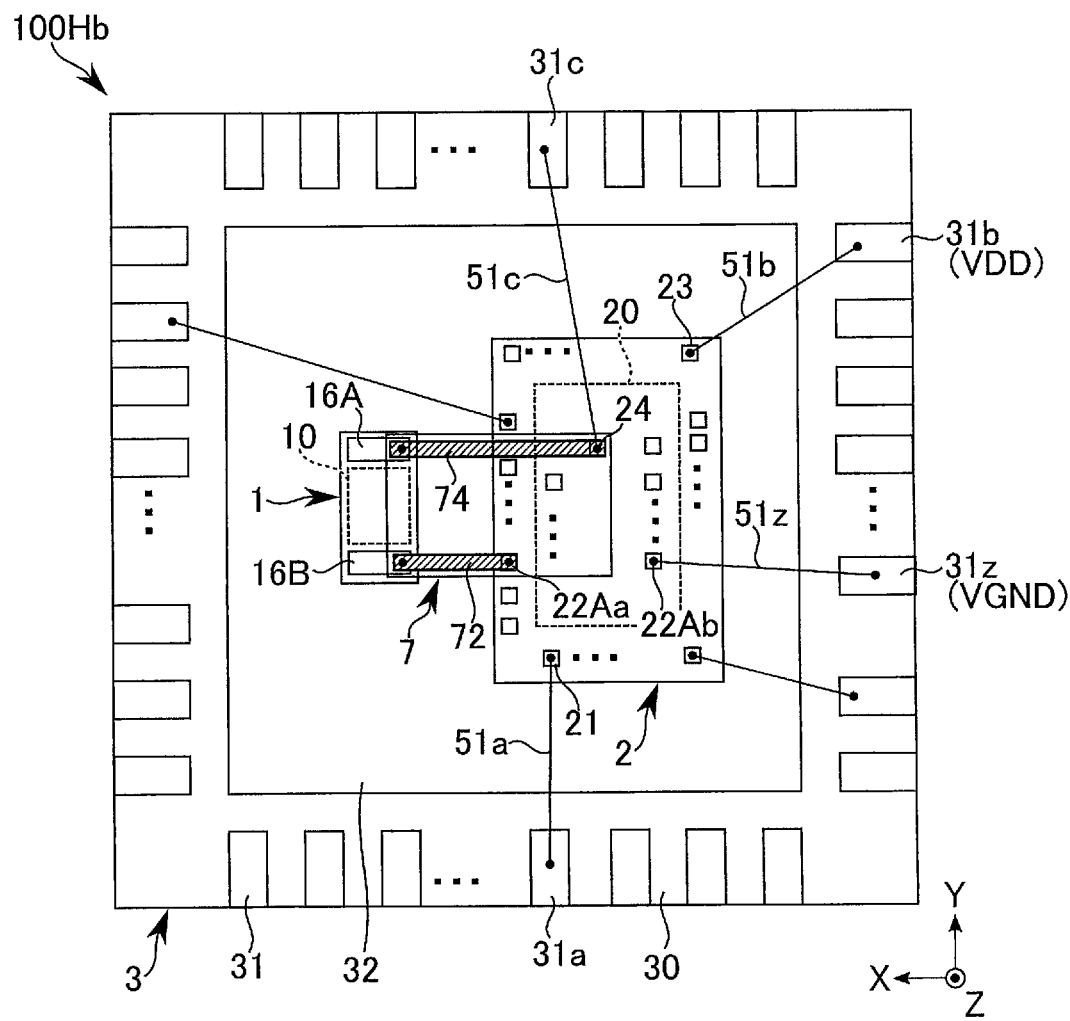
F I G. 25

SEMICONDUCTOR DEVICE

CROSS-REFERENCE TO RELATED APPLICATIONS

This application is based upon and claims the benefit of priority from Japanese Patent Application No. 2021-154689, filed Sep. 22, 2021, the entire contents of which are incorporated herein by reference.

FIELD

Embodiments described herein relate generally to a semiconductor device.

BACKGROUND

Research and development for improving electromagnetic compatibility (EMC) characteristics of a semiconductor device have been conducted.

BRIEF DESCRIPTION OF THE DRAWINGS

FIG. 1 is a diagram illustrating an electronic apparatus including a semiconductor device according to a first embodiment;

FIG. 11 is a top view illustrating a configuration example of a semiconductor device according to a third embodiment;

FIG. 13 is a top view illustrating a configuration example of a semiconductor device according to a fourth embodiment;

FIG. 15 is a top view illustrating a configuration example of the semiconductor device according to the fourth embodiment;

FIG. 18 is a top view illustrating a configuration example of a semiconductor device according to a sixth embodiment;

FIG. 20 is a diagram for explaining a method for manufacturing the semiconductor device according to the sixth embodiment;

FIG. 25 is a top view illustrating a configuration example of the semiconductor device according to the eighth embodiment.

DETAILED DESCRIPTION

Figure 2:
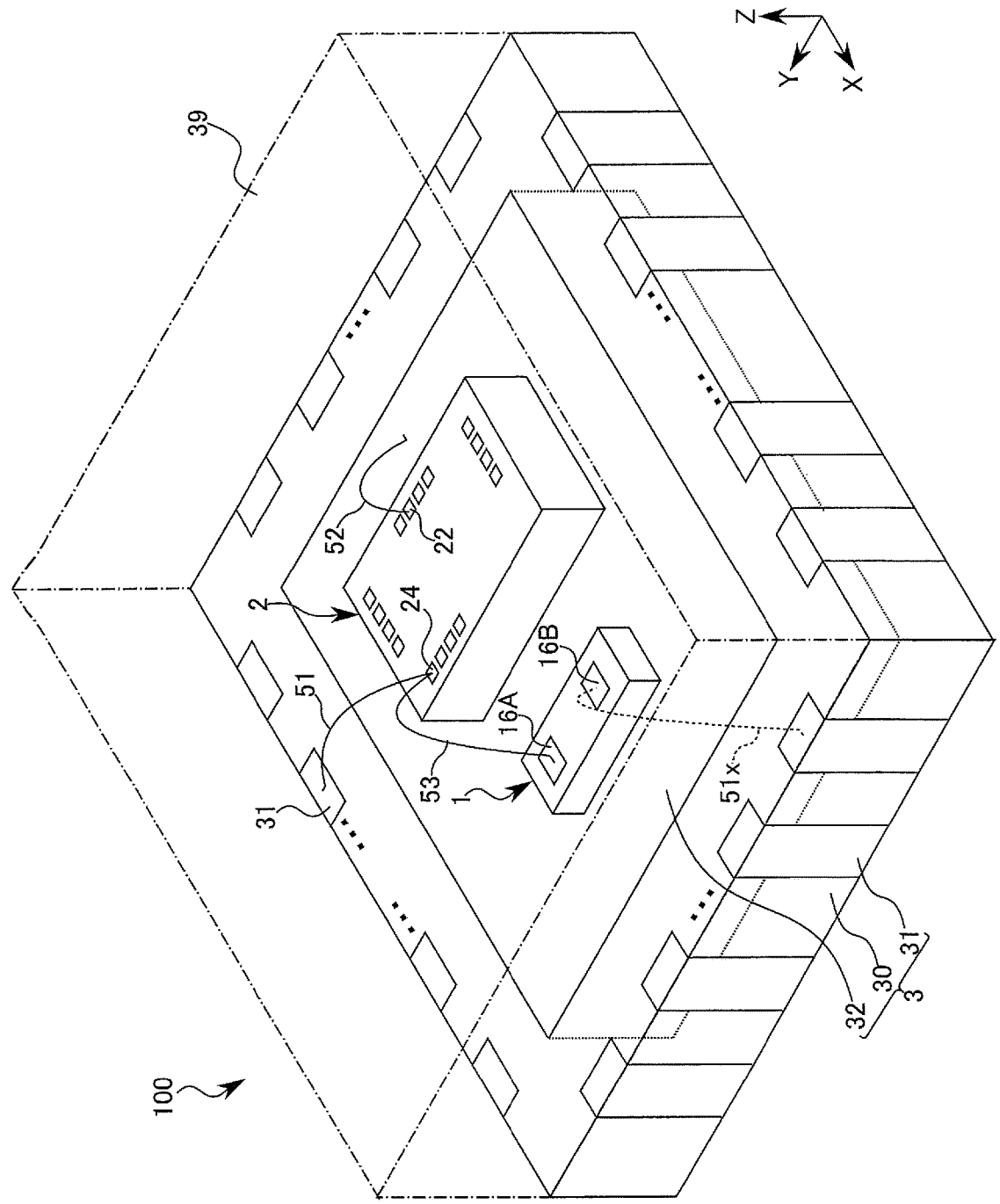
FIG. 2 is a bird's-eye view illustrating a configuration example of the semiconductor device according to the first embodiment.

A semiconductor device according to an embodiment will be described with reference to FIGS. 1 to 25.

Hereinafter, the present embodiment will be described in detail with reference to the drawings. In the following description, elements having the same function and configuration are denoted by the same reference numerals.

In addition, in each of the following embodiments, in a case where the components (for example, circuits, interconnects, various voltages and signals, and the like) with reference numerals/letters at the end for differentiation are not necessarily distinguished from each other, a description (reference numeral) in which the numerals/letters at the end are omitted is used.

Embodiment

In general, according to one embodiment, a semiconductor device includes: a package substrate including a base including a mount portion provided in a first surface and a contact portion provided in a second surface facing the first surface in a first direction perpendicular to the first surface, and a plurality of terminals adjacent to the base in a second direction parallel to the first surface; a semiconductor chip including a first pad to which a ground voltage is supplied, a second pad electrically connected to a first terminal among the plurality of terminals, and a semiconductor circuit connected to the first and second pads, the semiconductor chip being provided above the mount portion; and a first capacitor chip including a first capacitor unit provided in a first silicon substrate, a first node electrically connected to the first capacitor unit and supplied with the ground voltage, and a second node electrically connected to the second pad and the first capacitor unit, the first capacitor chip being provided above the mount portion.

(1) First Embodiment

A semiconductor device according to the first embodiment will be described with reference to FIGS. 1 to 9.

(a) Configuration Example

FIG. 1 is a schematic diagram for explaining an apparatus including a semiconductor device 100 according to the present embodiment.

As illustrated in FIG. 1, the semiconductor device 100 according to the present embodiment is provided in a certain electronic apparatus EA. For example, the electronic apparatus EA is a personal computer, a server, a smartphone, a feature phone, a mobile terminal (for example, a tablet terminal), an in-vehicle device, a game device, a home appliance, an image processing device (for example, a camera), an unmanned aerial vehicle, a wireless communication device (for example, a router and a base station), and the like.

The semiconductor device 100 includes, for example, a semiconductor integrated circuit such as an analog circuit, a processor (for example, a CPU or a GPU), a memory, and a controller, or a discrete device such as a sensor, a power device, and an optical device.

The semiconductor device 100 is disposed on a printed wiring board (for example, a mother board) 900 together with one or more other devices (for example, another semiconductor device or a passive element) 800 and 801. The semiconductor device 100 is connected to a plurality of interconnects (wirings) 91, 92, 93, 94A, and 94B of the printed wiring board (printed interconnect board) 900. The plurality of interconnects 91, 92, 93, 94A, and 94B is provided on the surface of the printed wiring board 900 or inside the printed wiring board 900. Each of the interconnects 91, 92, 93, 94A, and 94B is connected to one or more corresponding terminals among a plurality of terminals (connector, socket, or slot) 95, 96, 97A, and 97B provided in the printed wiring board 900.

The semiconductor device 100 is connected to the power supply terminal 95 via the interconnect (hereinafter, referred to as a power supply bus) 91. The power supply voltage VDD applied to the power supply terminal 95 is supplied to the semiconductor device 100 via the power supply bus 91.

The semiconductor device 100 is connected to the ground terminal 96 via the interconnect (hereinafter, referred to as a ground bus) 92. The ground voltage VGND applied to the ground terminal 96 is supplied to the semiconductor device 100 via the ground bus 92.

The power supply voltage VDD and the ground voltage VGND may be supplied from a power supply circuit (not illustrated) provided on the printed wiring board 900 to the semiconductor device 100 via each of the wirings 91 and 92. The ground voltage VGND may be supplied to a ground plane (GND plane) of the printed wiring board 900. Note that the voltage VDD is a power supply voltage (reference voltage) on a high potential side in the semiconductor device 100, and the voltage VGND is a power supply voltage (reference voltage) on a low potential side in the semiconductor device 100.

The semiconductor device 100 is electrically connected to the semiconductor device 800 (or the passive element 801) via the interconnect (hereinafter, it is referred to as a signal bus) 93. The semiconductor device 100 can transfer a signal (and data) between the semiconductor device 800 and the semiconductor device 100 via the signal bus 93.

The semiconductor device 100 is connected to an input/output terminal (I/O terminal) 97A for signal transfer via the interconnect (signal bus) 94A.

The semiconductor device 800 includes, for example, a semiconductor integrated circuit or a discrete device. Note that the semiconductor device 800 may be a device modularized by a plurality of chips and a plurality of passive elements.

The passive element 801 is, for example, a passive element such as a capacitor, an inductor, a resistor, and a switch.

For example, the semiconductor device 800 and the passive element 801 are connected to the power supply bus 91 and the ground bus 92. The semiconductor device 800 and the passive element 801 are connected to the I/O terminal 97B via the interconnect (signal bus) 94B.

The semiconductor device 100 according to the present embodiment includes a plurality of semiconductor chips (also referred to as dies) 1 and 2 provided in a package member on a package substrate.

FIG. 2 is a schematic bird's-eye view illustrating a basic configuration of the semiconductor device 100 according to the present embodiment.

As illustrated in FIG. 2, in the semiconductor device 100 according to the present embodiment, the plurality of semiconductor chips 1 and 2 is provided on the upper surface of a package substrate 3 (a surface facing the surface on the printed wiring board 900 side in the Z direction). The upper surface of the package substrate 3 is a surface facing the surface of the package substrate 3 on the printed wiring board 900 side. The lower surface of the package substrate 3 is a surface of the package substrate 3 on the printed wiring board 900 side.

The semiconductor chips 1 and 2 are covered with a package member (a member indicated by an alternate long and short dash line in FIG. 2) 39 on the package substrate 3. The package member (also referred to as a sealing member) 39 is, for example, an insulating resin (for example, a molding resin).

For example, the semiconductor device (hereinafter, also referred to as a semiconductor package) 100 according to the present embodiment has a quad flat non-leaded package (QFN) structure. The package substrate 3 is a package substrate for a QFN structure.

The package substrate 3 includes a substrate layer 30, a plurality of leads 31, and a base 32.

The substrate layer (substrate member) 30 is an insulating layer (insulating resin). The substrate layer 30 is a support member for the plurality of leads 31 and the base 32. At the same time, the substrate layer 30 electrically isolates the plurality of leads 31 and the base 32 in a manner that each of the plurality of leads 31 and the base 32 functions as an electrically separated portion.

The plurality of leads (terminal and connection terminal) 31 is provided in a first region (hereinafter, also referred to as an outer peripheral region) R1 along the four sides of the package substrate 3. The outer peripheral region R1 is a region between a region at the center (hereinafter, referred to as a central region) R2 of the package substrate 3 and an end (four sides) of the package substrate 3 in a direction parallel to the upper surface of the package substrate 3.

The plurality of leads 31 is arranged at certain intervals in the substrate layer 30 along each of the four sides of the package substrate 3. For example, in the QFN structure, the position of the end (side surface) of the leads 31 on each side of the package substrate 3 is substantially aligned with the position of the end (side surface) of the substrate layer 30. Each of the leads 31 is a terminal (external connection terminal) for connecting the semiconductor device 100 to a bus or another device (a device provided outside the package substrate 3) on the printed wiring board 900.

The leads 31 are conductors (for example, metal).

The base 32 is provided in the central region R2 surrounded by the outer peripheral region R1 of the package substrate 3. The base 32 provided at the center of the package substrate 3 has a quadrangular planar structure when viewed from the upper surface side of the package substrate 3. Four sides of the base 32 in the direction parallel to the upper surface of the package substrate 3 are surrounded by the leads 31. The base 32 is separated from the leads 31 by the substrate layer 30.

The base 32 is used as a mount portion of the chips 1 and 2 in the package member 39. At the same time, the base 32 is used as a contact portion (external connection terminal) for connecting the semiconductor device 100 and a bus (or another device) on the printed wiring board 900. As described above, the base 32 includes a mount portion (mount region) provided with one or more chips and a contact portion (contact region) configured to be used as a connection terminal of the semiconductor device 100. Note that the base 32 may also be referred to as a package bed (PKG bed), a die pad, a stage, or a base layer (base member).

The base 32 is a conductor (for example, metal). However, the base 32 may include an insulator in a portion.

The leads 31 are electrically connected to a bus (for example, the signal buses 93 and 94A or the power supply bus 91) of the printed wiring board 900 via a conductor (also referred to as a bump portion) such as a stud bump or a solder ball.

The base 32 is an E-pad (exposed-pad) in the package substrate 3. The lower surface of the base 32 is exposed through the opening of the substrate layer 30. The lower surface of the base 32 is a surface of the base 32 on the printed wiring board 900 side in the Z direction.

The base 32 is electrically connected to a bus (for example, the ground bus 92) or another device of the printed wiring board 900 via a conductor such as a stud bump or a solder ball connected to the lower surface of the base 32.

The semiconductor chips 1 and 2 are disposed on the upper surface of the base 32. The upper surface of the base 32 is a surface facing a surface (lower surface) of the base 32 on the printed wiring board 900 side in the Z direction.

The semiconductor chip 1 is a chip of a passive element.

In the present embodiment, the semiconductor chip 1 is a chip including a capacitor (capacitive element) provided in a silicon substrate (Si substrate). Hereinafter, the semiconductor chip 1 is referred to as a Si capacitor chip (alternatively, a Si capacitor or a chip capacitor) 1.

The Si capacitor chip 1 includes nodes (for example, pads) 16A and 16B as connection terminals. The nodes 16A and 16B are connected to a capacitor inside the chip 1.

The size of the Si capacitor chip 1 (for example, thickness) is smaller than the size of the multilayer ceramic capacitor chip (for example, the device 801 of FIG. 1). The inductance of the Si capacitor chip 1 is smaller than the inductance of the multilayer ceramic capacitor chip. In addition, the Si capacitor chip 1 can obtain higher heat resistance and higher stability as compared with the multilayer ceramic capacitor chip.

The semiconductor chip 2 is a chip including a semiconductor circuit or a semiconductor element for executing a desired function and/or processing of the semiconductor device 100. For example, the semiconductor chip 2 is a chip including an integrated circuit (IC) formed on a silicon substrate. Hereinafter, the semiconductor chip 2 is referred to as an IC chip (or simply IC) 2.

The IC chip 2 includes pads 22 and 24 as connection terminals. The pads 22 and 24 are connected to an integrated circuit inside the chip 2.

Note that the semiconductor chip 2 may be, for example, a chip of a semiconductor integrated circuit such as a logic circuit, an analog circuit, a processor, a memory, and a controller, or a chip including a discrete device such as a sensor, a power device, and an optical device.

In the package member 39, the leads 31 and the base 32 are connected to the IC chip 2 via a bonding wire (hereinafter, also simply referred to as a wire).

The leads 31 are electrically connected to the corresponding certain pad 24 among the plurality of pads of the IC chip 2 via a wire 51.

The base 32 is electrically connected to the corresponding certain pad 22 among the plurality of pads of the IC chip 2 via a wire 52 connected to the upper surface of the base 32. For example, the ground voltage VGND is applied to the base 32 via the contact portion on the lower surface of the base 32.

The pad 22 may be connected to the leads 31 to which the ground voltage VGND is applied.

The certain pad 24 of the IC chip 2 is electrically connected to certain leads 31 via the wire 51, and is electrically connected to the node 16A of the Si capacitor chip 1 via a wire 53.

The node 16B of the Si capacitor chip 1 is electrically connected to a certain terminal (the leads 31 or the base 32) to which the ground voltage VGND is applied via a wire (broken line in FIG. 2) 51$x$. Note that FIG. 2 illustrates an example in which the node 16B is connected to a lead, but the node 16B may be connected to the base 32 to which the ground voltage VGND is applied.

In the present embodiment, the Si capacitor chip 1 is provided on the same package substrate 3 as the IC chip 2. As a result, the semiconductor device 100 according to the present embodiment can shorten a connection path (signal path) for connecting the Si capacitor chip 1 and the IC chip 2. Accordingly, the semiconductor device 100 according to the present embodiment can reduce parasitic impedance generated in the Si capacitor chip 1 and the IC chip 2.

In addition, in the present embodiment, the Si capacitor chip 1 as a passive element is provided on the package substrate 3 (in the package member 39) common to the IC chip 2. As a result, the semiconductor device 100 according to the present embodiment can reduce the number of devices (for example, capacitor chips) on the printed wiring board 900.

Note that the semiconductor device 100 according to the present embodiment is not limited to the QFN structure as long as both the Si capacitor chip 1 and the IC chip 2 have a structure provided on the base 32. For example, the semiconductor device 100 according to the present embodiment may have a small outline non-leaded package (SON) structure, a ball grid array (BGA) structure, and the like.

The semiconductor device 100 according to the present embodiment may be a semiconductor package having an air cavity structure (also referred to as an air package structure). When the semiconductor device 100 according to the present embodiment has an air cavity structure, a frame (housing) made of an insulating material is provided on the package substrate 3. The space between the frame (not illustrated) and the chips 1 and 2 is filled with air. As described above, in the air cavity structure, the Si capacitor chip 1 and the IC chip 2 are provided in the frame on the package substrate 3 without being sealed by the insulating resin (package member 39).

A more specific configuration example of the semiconductor device 100 according to the present embodiment will be described with reference to FIGS. 3 to 5.

Figure 3:
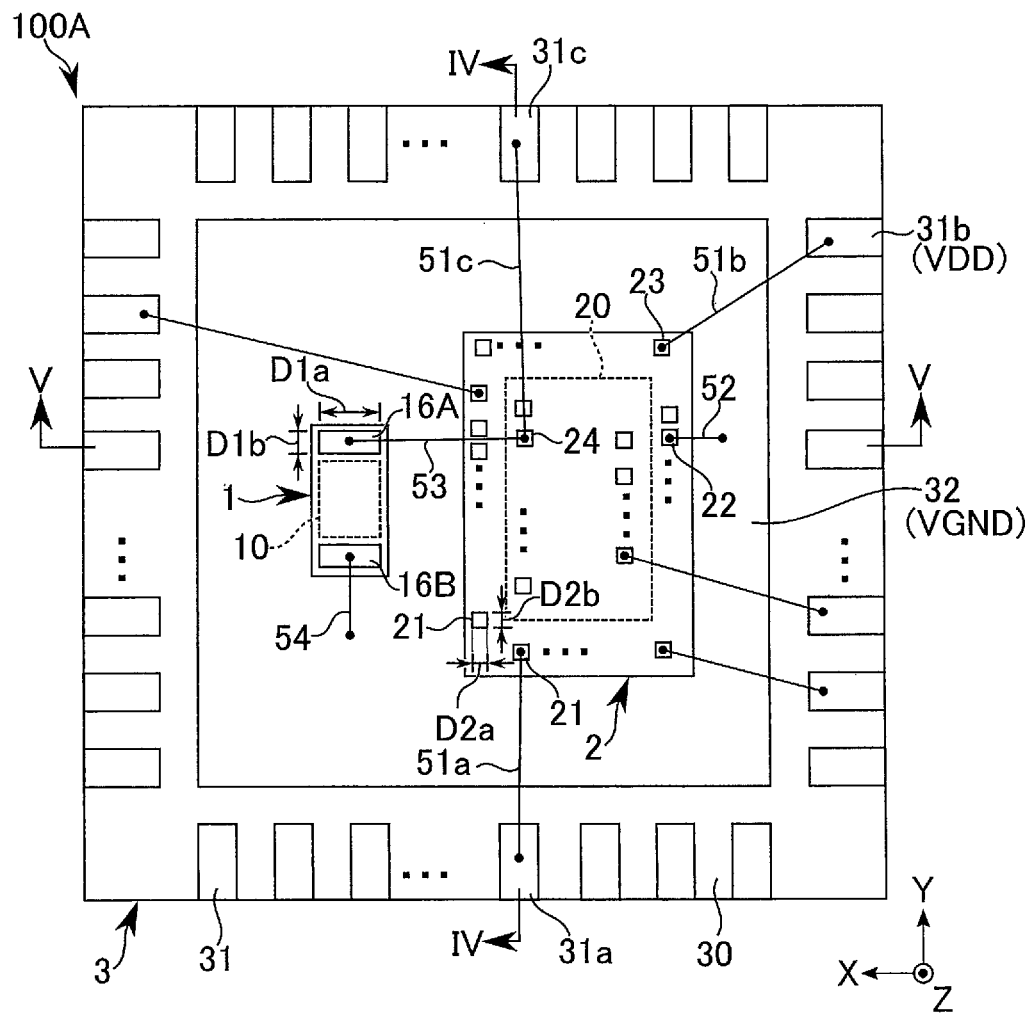
FIG. 3 is a top view illustrating a configuration example of the semiconductor device according to the first embodiment.
Figure 4:
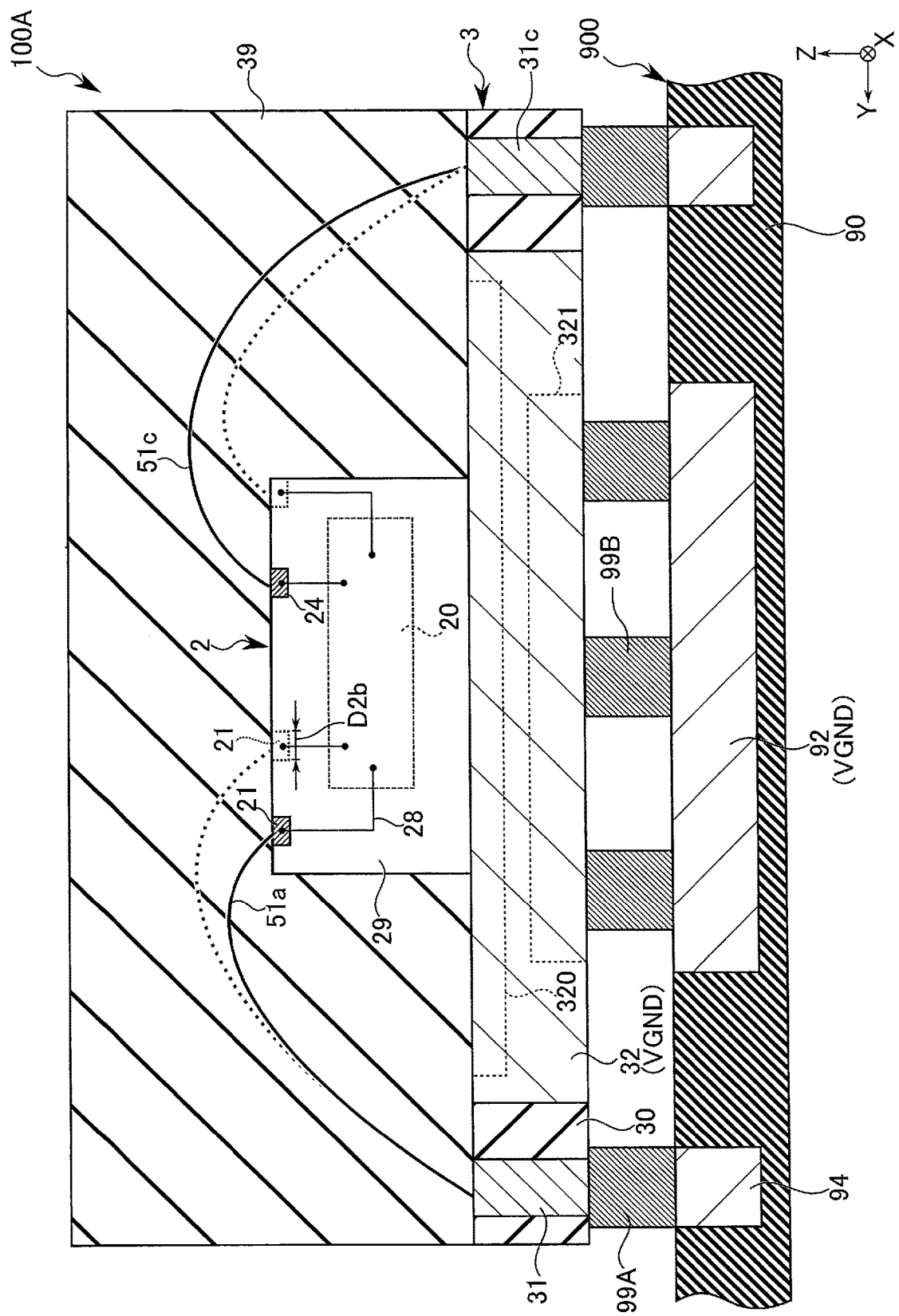
FIG. 4 is a cross-sectional view taken along line IV-IV of FIG. 3.
Figure 5:
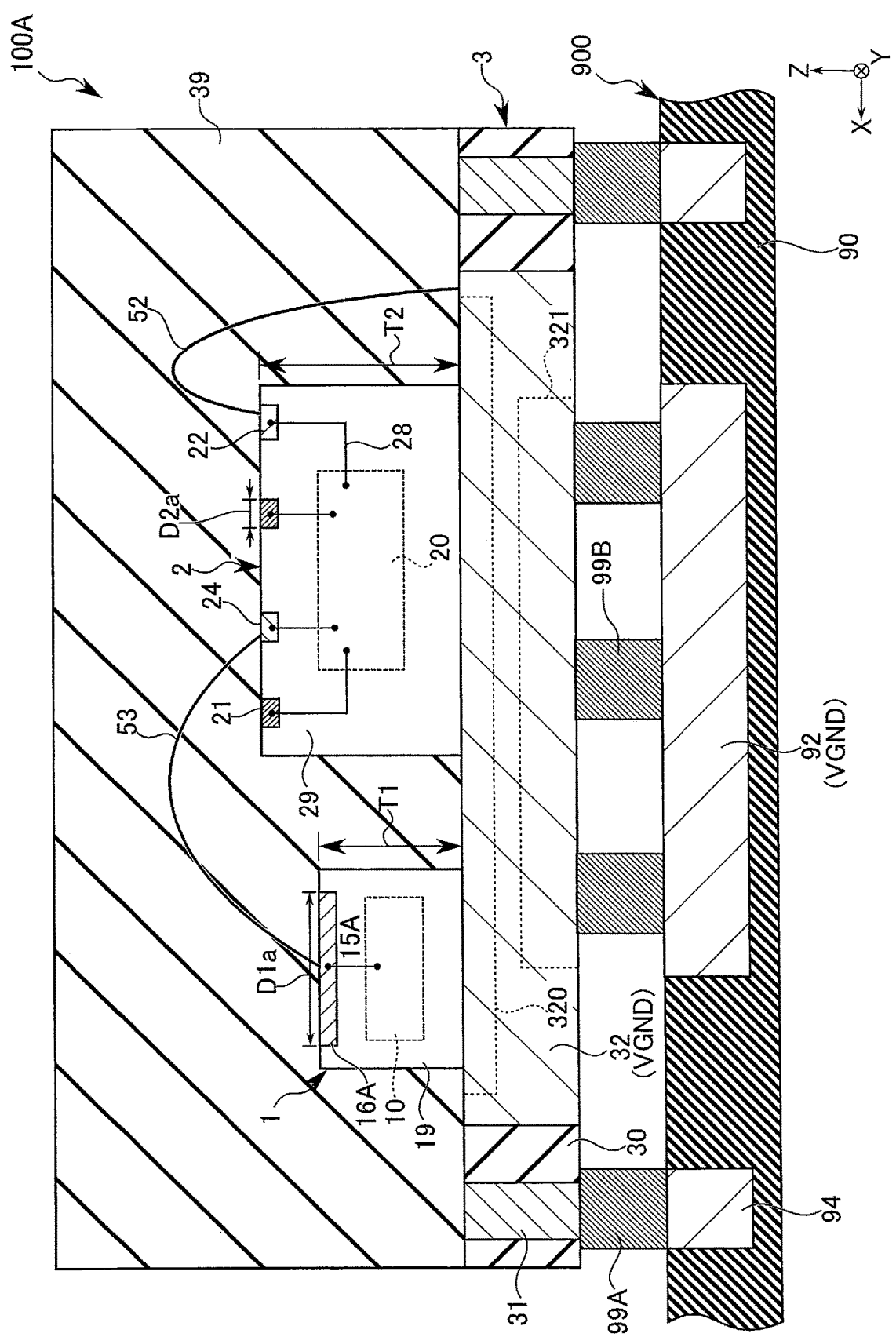
FIG. 5 is a cross-sectional view taken along line V-V of FIG. 4.

FIGS. 3 to 5 are schematic diagrams illustrating more specific examples of the configuration example of a semiconductor device 100A according to the present embodiment. FIG. 3 is a top view illustrating a configuration example of the semiconductor device 100A according to the present embodiment. FIG. 4 is a cross-sectional view illustrating a configuration example of the semiconductor device 100A according to the present embodiment, and illustrates a cross section taken along line IV-IV of FIG. 3. FIG. 5 is a cross-sectional view illustrating a configuration example of the semiconductor device 100A according to the present embodiment, and illustrates a cross section taken along line V-V of FIG. 3. Note that in FIGS. 4 and 5, a certain member existing in the depth direction or the front direction of the paper surface is indicated by a dotted line.

As illustrated in FIGS. 3 to 5, the semiconductor device 100A according to the present embodiment is connected to the printed wiring board 900 via the leads 31 and the base 32 of the package substrate 3. The leads 31 are electrically connected to the signal bus 94 (or the signal bus 93, or power supply bus 91) of the printed wiring board 900 via a conductor 99A. The base 32 is electrically connected to the ground bus 92 of the printed wiring board 900 via a conductor 99B. For example, the conductor 99B is connected to a contact portion 321 on the lower surface of the base 32.

As described above, in FIGS. 3 to 5, the Si capacitor chip 1 and the IC chip 2 are provided on a mount portion 320 on the upper surface of the base 32 of the package substrate 3.

On the upper surface of the base 32 of the package substrate 3, the IC chip 2 is adjacent to the Si capacitor chip 1 in the X direction.

The IC chip 2 includes a circuit unit 20, a plurality of pads 21, 22, and 23, and an internal interconnect 28.

The circuit unit 20 is provided in the IC chip 2. The circuit unit 20 is, for example, a semiconductor integrated circuit formed on a semiconductor substrate (for example, a silicon substrate) of the IC chip 2 by a known semiconductor process. The circuit unit 20 is covered with an insulating layer 29.

The plurality of pads 21, 22, 23, and 24 is provided on the upper surface side of the IC chip 2. Note that the upper surface of the IC chip 2 is a surface facing a surface of the IC chip 2 on the base 32 side (a surface in contact with the base 32) in the Z direction.

Each of the pads 21, 22, 23, and 24 is connected to any one or more of the leads 31 (31a, 31b, and 31c), the base 32, and the Si capacitor chip 1.

For example, the pad (hereinafter, also referred to as a signal pad) 21 is electrically connected to the lead (hereinafter, also referred to as I/O lead) 31a for signal input and output via a wire 51a. A signal from another device (for example, the semiconductor device 800) is input from the lead 31a to the IC chip 2 via the wire 51a. The signal of the IC chip 2 is output from the IC chip 2 to the lead 31a a via the wire 51a.

For example, the pad (hereinafter, also referred to as a ground pad) 22 is electrically connected to the base 32 via the wire 52. For example, the ground voltage VGND is applied to the base 32 via the contact portion 321. As a result, the ground voltage VGND is supplied to the IC chip 2 via the base 32 and the wire 52.

For example, the pad (hereinafter, also referred to as a power supply pad) 23 is electrically connected to the lead (hereinafter, referred to as a power supply lead) 31b to which the power supply voltage VDD is applied via a wire 51b. As a result, the power supply voltage VDD is supplied to the IC chip 2 via the lead 31b and the wire 51b.

The pad 24 is connected to the lead 31c via a wire 51c. The pad 24 is electrically connected to the Si capacitor chip 1 via the wire 53. The lead 31c may be an I/O lead or a power supply lead.

Each of the pads 21, 22, 23, and 24 is electrically connected to a corresponding circuit block in the circuit unit 20 via the internal interconnect 28 in the insulating layer 29.

The internal interconnect 28 is a multilayer interconnects (stack including a plurality of conductive layers, a plurality of plugs, and a plurality of insulating layers) formed by a known semiconductor process.

The Si capacitor chip 1 stabilizes a voltage applied to the IC chip 2 or removes noise generated in the signal transmission path in the IC chip 2. For example, the Si capacitor chip 1 suppresses generation of noise generated in the pad 24 as a signal pad.

The Si capacitor chip 1 includes a capacitor unit (also referred to as an element unit or an Si capacitor unit) 10 and the plurality of nodes 16 (16A and 16B).

Figure 6:
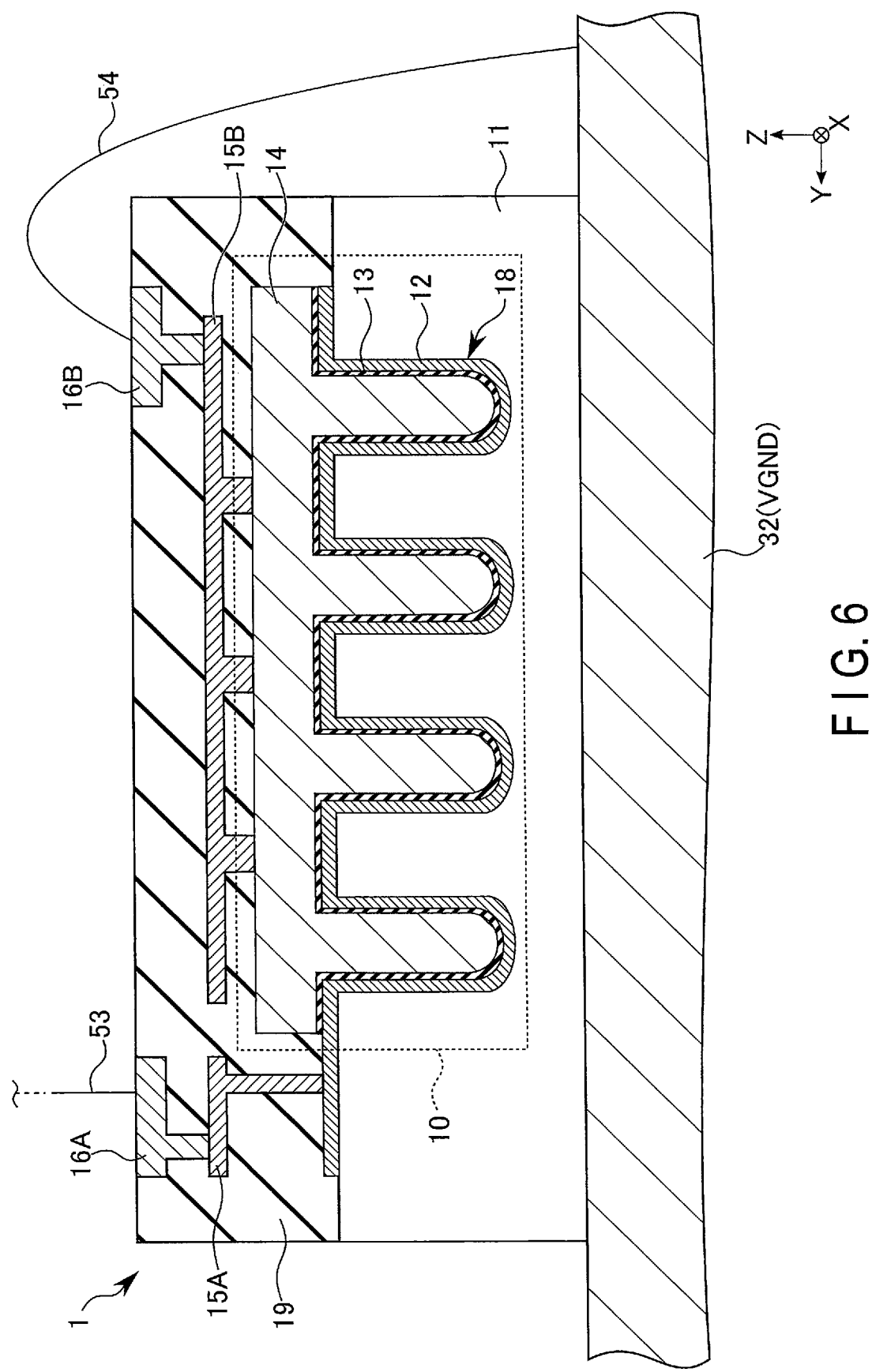
FIG. 6 is a cross-sectional view illustrating a structure of an element in the semiconductor device according to the first embodiment.

FIG. 6 is a cross-sectional view schematically illustrating a structure example of the Si capacitor chip 1 in the semiconductor device 100A according to the present embodiment. FIG. 6 illustrates a cross-sectional structure of the Si capacitor chip 1 along a direction (for example, the Y direction in FIGS. 3 to 5) in which the two nodes 16 of the Si capacitor chip 1 are arranged.

As illustrated in FIG. 6, in the Si capacitor chip 1, the capacitor unit 10 is provided in the Si substrate 11.

The capacitor unit 10 includes two electrodes 12 and 14 and an insulating layer 13. Hereinafter, each of the electrodes 12 and 14 is referred to as capacitor electrode 12 and 14, and the insulating layer 13 is referred to as a capacitor insulating layer 13.

For example, the capacitor unit 10 has a trench capacitor structure.

A plurality of trenches 18 is provided in a Si substrate 11. The trenches 18 extend from the upper surface to the lower surface of the Si substrate 11. The opening of the trenches 18 is provided on the upper surface side of the Si substrate 11, and the bottom of the trenches 18 is provided on the lower surface side of the Si substrate 11.

The capacitor electrodes 12 and 14 and the capacitor insulating layer 13 are provided in each of the trenches 18 to extend over the plurality of trenches 18.

The capacitor electrode 12 includes a plurality of recessed portions along the inner wall of the trenches 18. For example, the capacitor electrode 12 is a semiconductor region including a P-type dopant formed in the Si substrate 11. However, the capacitor electrode 12 may be a polysilicon layer formed on the Si substrate 11 (on the inner wall of the trenches 18).

The capacitor electrode 14 includes a portion extending in a direction (Z direction) perpendicular to the upper surface of the Si substrate 11 and a portion extending in a direction (for example, in the Y direction) parallel to the upper surface of the Si substrate 11. A portion of the capacitor electrode 14 extending in the Z direction is provided in the trenches 18. A portion of the capacitor electrode 14 extending in the Y direction is provided above the Si substrate 11 in the Z direction outside the trenches 18. For example, the capacitor electrode 14 is a polysilicon layer.

The capacitor insulating layer 13 has a structure including a plurality of recessed portions along the shape of the inner wall of the trenches 18 (the shape of the capacitor electrode 12). The capacitor insulating layer 13 is provided between the two capacitor electrodes 12 and 14. The capacitor insulating layer 13 is, for example, a silicon oxide layer. For example, the capacitor insulating layer 13 is formed by oxidizing a silicon layer (capacitor electrode 12).

In the trenches 18, the capacitor electrode 14 faces the capacitor electrode 12 via the capacitor insulating layer 13. As a result, the facing area between the capacitor electrodes 12 and 14 increases. Accordingly, the capacitance of the Si capacitor chip 1 increases while the chip size of the Si capacitor chip 1 is reduced.

Note that the structures of the capacitor electrodes 12 and 14 and the capacitor insulating layer 13 are not limited to the example illustrated in FIG. 6, and are appropriately changed according to the structure of the capacitor unit 10. The materials of the capacitor electrodes 12 and 14 and the material of the capacitor insulating layer 13 are not limited to the above-described examples.

An insulating layer (for example, a passivation layer) 19 is provided on the Si substrate 11 to cover the Si substrate 11.

Interconnect layers 15A, 15B, 16A, and 16B are provided in the insulating layer 19. Each of the interconnect layers 15A, 15B, 16A, and 16B is a conductor including at least one of a plug and a conductive layer.

The interconnect layer 15A is electrically connected to the capacitor electrode 12 in the insulating layer 19. The interconnect layer 15B is electrically connected to the capacitor electrode 14 in the insulating layer 19. The interconnect layers 15A and 15B function as an internal interconnect 15 of the Si capacitor chip 1.

The interconnect layers 16A and 16B are provided above the interconnect layers 15A and 15B in the Z direction. The interconnect layer 16A is provided on the interconnect layer 15A. The interconnect layer 16A is electrically connected to the capacitor electrode 12 via the interconnect layer 15A. The interconnect layer 16B is provided on the interconnect layer 15B. The interconnect layer 16B is electrically connected to the capacitor electrode 14 via the interconnect layer 15B.

The interconnect layers 16A and 16B have portions exposed from the insulating layer 19. The interconnect layers 16A and 16B function as nodes (for example, pads) for connecting the Si capacitor chip 1 and members outside the Si capacitor chip 1.

Note that the structure of the interconnect layers 15A, 15B, 16A, and 16B is not limited to the example illustrated in FIG. 6, and is appropriately changed according to the structure of the capacitor unit 10.

As described above, the capacitor unit (Si capacitor) 10 is provided outside the chip 2 provided with the circuit unit 20. The Si capacitor unit 10 and the circuit unit 20 provided in the different chips 1 and 2 are electrically connected using a connection member such as a wire.

Returning to FIGS. 3 to 5, the structure of the semiconductor device 100A according to the present embodiment will be described again.

In the IC chip 2, the plurality of pads 21, 22, 23, and 24 have substantially the same size. In the Si capacitor chip 1, the size of the nodes 16 is larger than the size of the pads 21, 22, 23, and 24 of the IC chip. For example, a dimension D1a of the nodes 16 of the Si capacitor chip 1 in the X direction is larger than a dimension D2a of the pad 21 of the IC chip 2 in the X direction. For example, a dimension D1b of the nodes 16 of the Si capacitor chip 1 in the Y direction is larger than a dimension D2b of the pad 21 of the IC chip 2 in the Y direction.

As a result, the nodes 16 (16A and 16B) of the Si capacitor chip 1 can realize a small inductance as compared with the pads 21, 22, 23, and 24 of the IC chip 2.

For example, a dimension (thickness of the chip 1) T1 of the Si capacitor chip 1 in the Z direction is smaller than a dimension (thickness of the chip 2) T2 of the IC chip 2 in the Z direction. For example, the thickness T1 of the Si capacitor chip 1 is about 80 μm (micrometers) to 100 μm. The thickness T2 of the IC chip 2 is about 100 μm to 300 μm. However, depending on the type of the IC chip 2, the thickness T2 of the IC chip 2 may be smaller than the thickness T1 of the Si capacitor chip 1. The dimension of the stack ceramic capacitor (for example, the device 801 of FIG. 1) in the Z direction is about 200 μm or more.

For example, the dimension of the Si capacitor chip 1 in the X-Y plane (the area of the chip 1) is smaller than the dimension of the IC chip 2 in the X-Y plane (the area of the chip 2).

As described above, the size of the Si capacitor chip 1 is smaller than the size of the IC chip 2. Therefore, as in the present embodiment, the Si capacitor chip 1 can be disposed on the same package substrate 3 as the IC chip 2.

In the semiconductor device 100A of FIGS. 3 to 5, the node (hereinafter, also referred to as a ground node for differentiation) 16B of the Si capacitor chip 1 is electrically connected to the base 32 via the wire 54. As described above, the ground voltage VGND is supplied to the base 32. The Si capacitor chip 1 and the IC chip 2 are commonly electrically connected to a base 32 as a ground terminal of the package substrate 3. Therefore, the ground voltage VGND is supplied from the same base (ground terminal) 32 as the IC chip 2 to the Si capacitor chip 1.

As a result, in the present embodiment, the parasitic impedance on the ground side of the Si capacitor chip 1 can be reduced.

Accordingly, the semiconductor device 100A according to the present embodiment can improve electromagnetic compatibility (EMC) characteristics of the Si capacitor chip 1 and the IC chip 2.

Note that an insulating layer (not illustrated) may be provided between the IC chip 2 and the base 32. The insulating layer functions as an adhesive member between the IC chip 2 and the base 32 and/or a separation member for preventing a short circuit between the IC chip 2 and the base 32. Similarly, an insulating layer as an adhesive member and/or a separation member may be provided between the Si capacitor chip 1 and the base 32.

(b) Modification

Figure 7:
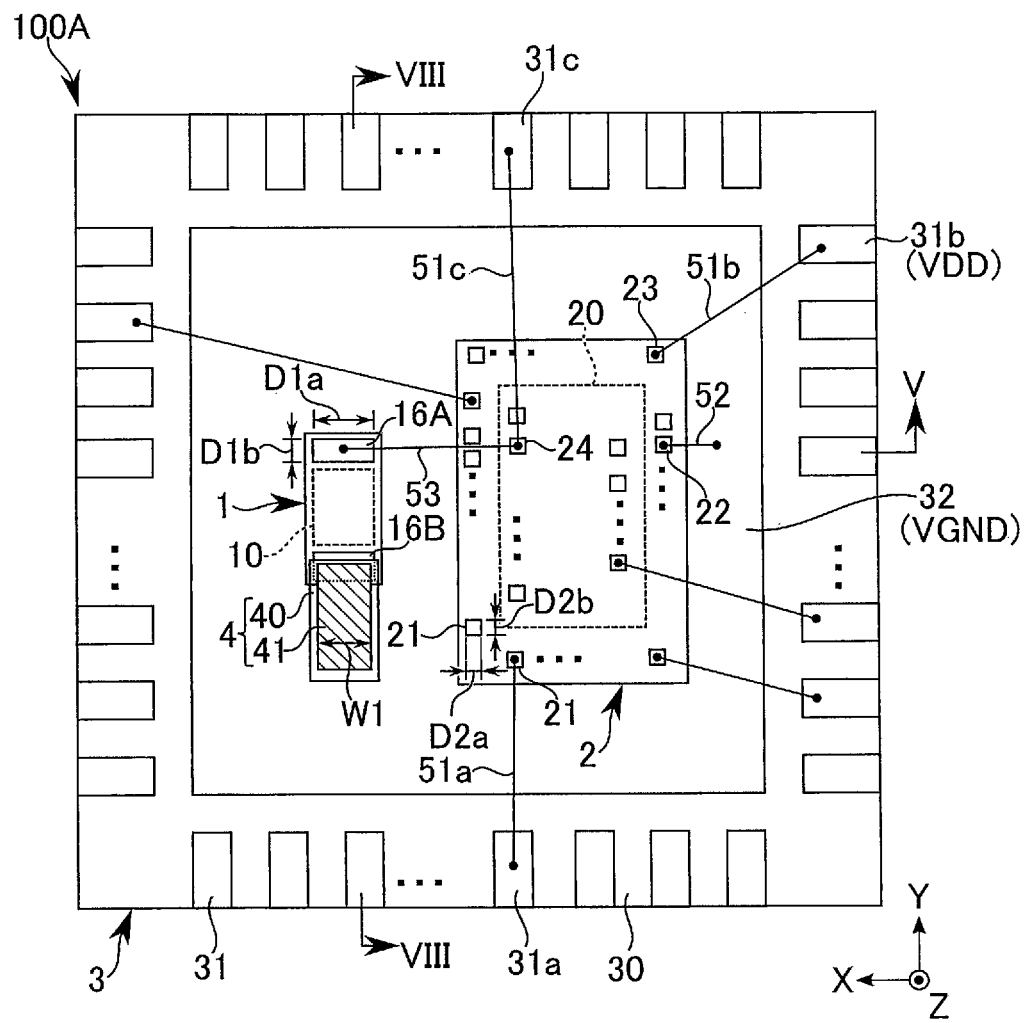
FIG. 7 is a top view illustrating a configuration example of the semiconductor device according to the first embodiment.
Figure 8:
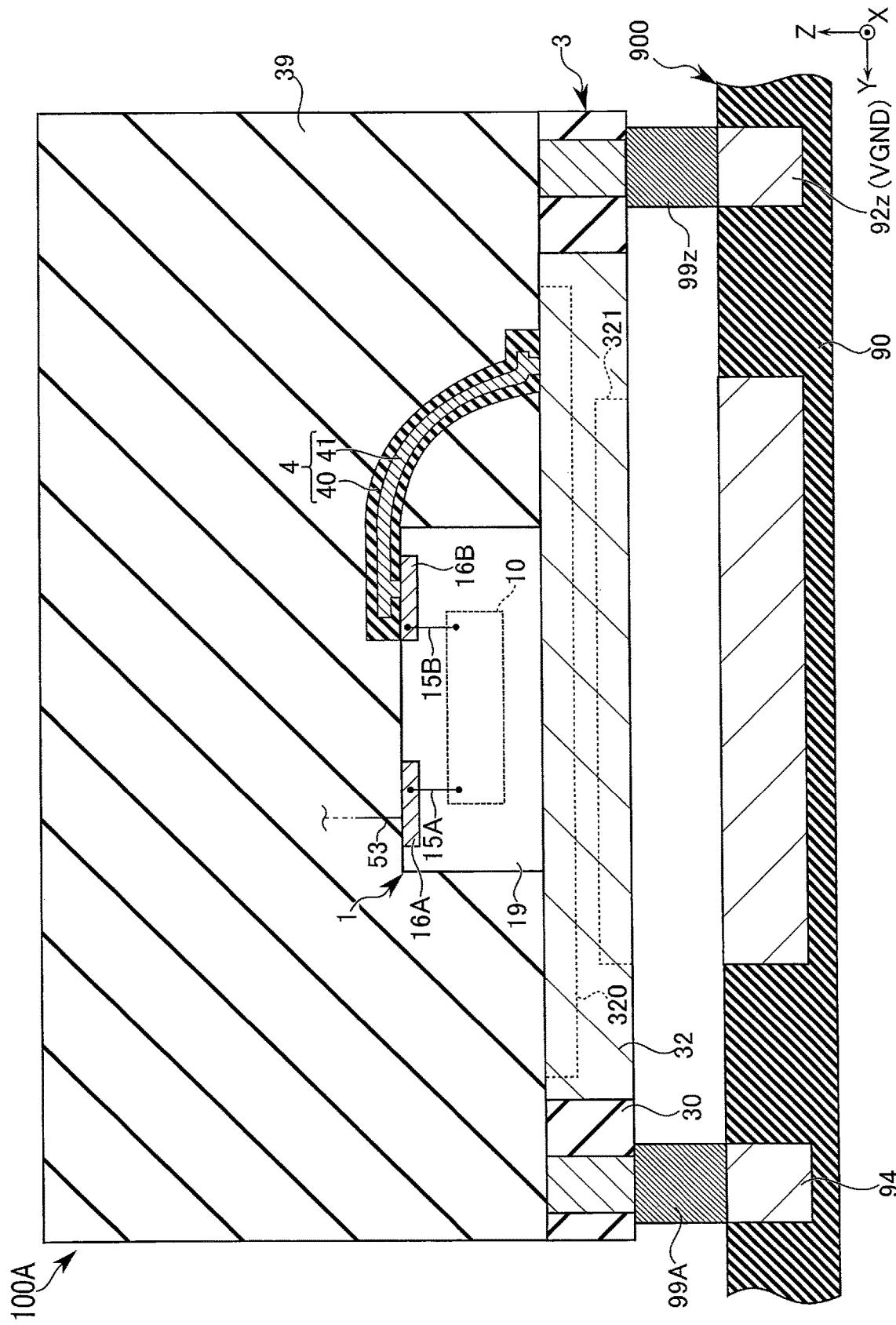
FIG. 8 is a cross-sectional view taken along line VIII-VIII of FIG. 7.

FIGS. 7 and 8 are diagrams illustrating modifications of the semiconductor device 100A of FIGS. 3 to 5.

FIG. 7 is a top view illustrating a configuration example of the semiconductor device 100A according to a modification. FIG. 8 is a cross-sectional view schematically illustrating a cross-sectional structure of the semiconductor device 100A of FIG. 7, and illustrates a cross section taken along line VIII-VIII of FIG. 7.

As illustrated in FIGS. 7 and 8, in the semiconductor device 100A, the ground node 16B of the Si capacitor chip 1 may be connected to the base 32 by using a flexible printed circuit substrate (hereinafter, also referred to as an FPC substrate) 4.

As described above, the size of the nodes 16 of the Si capacitor chip 1 is larger than the size of the pad of the IC chip 2. Therefore, the nodes 16 of the Si capacitor chip 1 can be connected to another member (here, the base 32) by connection using the FPC substrate 4.

The FPC substrate 4 includes a thin-film-like insulating layer (for example, the insulating organic substance layer) 40 and interconnect (conductive layer) 41 in the insulating layer 40. The insulating layer 40 covers the interconnect 41. One end and the other end of the interconnect 41 are each exposed through an opening provided in the insulating layer 40. Note that a plurality of interconnects 41 may be provided in the insulating layer 40.

One end of the interconnect 41 is electrically connected to the ground node 16B of the Si capacitor chip 1. The other end of the interconnect 41 is electrically connected to the base 32 to which the ground voltage VGND is applied.

A thickness (in the example of FIG. 7, the dimension in the X direction) W1 of the interconnect 41 is larger than the thickness of the bonding wire. Therefore, the cross-sectional area of the interconnect 41 is larger than the cross-sectional area of the wire. Accordingly, the semiconductor device 100A in FIGS. 7 and 8 can further reduce the parasitic impedance between the ground node 16B of the Si capacitor chip 1 and the base 32 to which the ground voltage VGND is applied by the connection using the FPC substrate 4.

Therefore, the semiconductor device 100A of FIG. 7 can improve the EMC characteristics of the Si capacitor chip 1 and the IC chip 2.

(c) Characteristics

Characteristics of the semiconductor device according to the present embodiment will be described with reference to FIG. 9.

Figure 9:
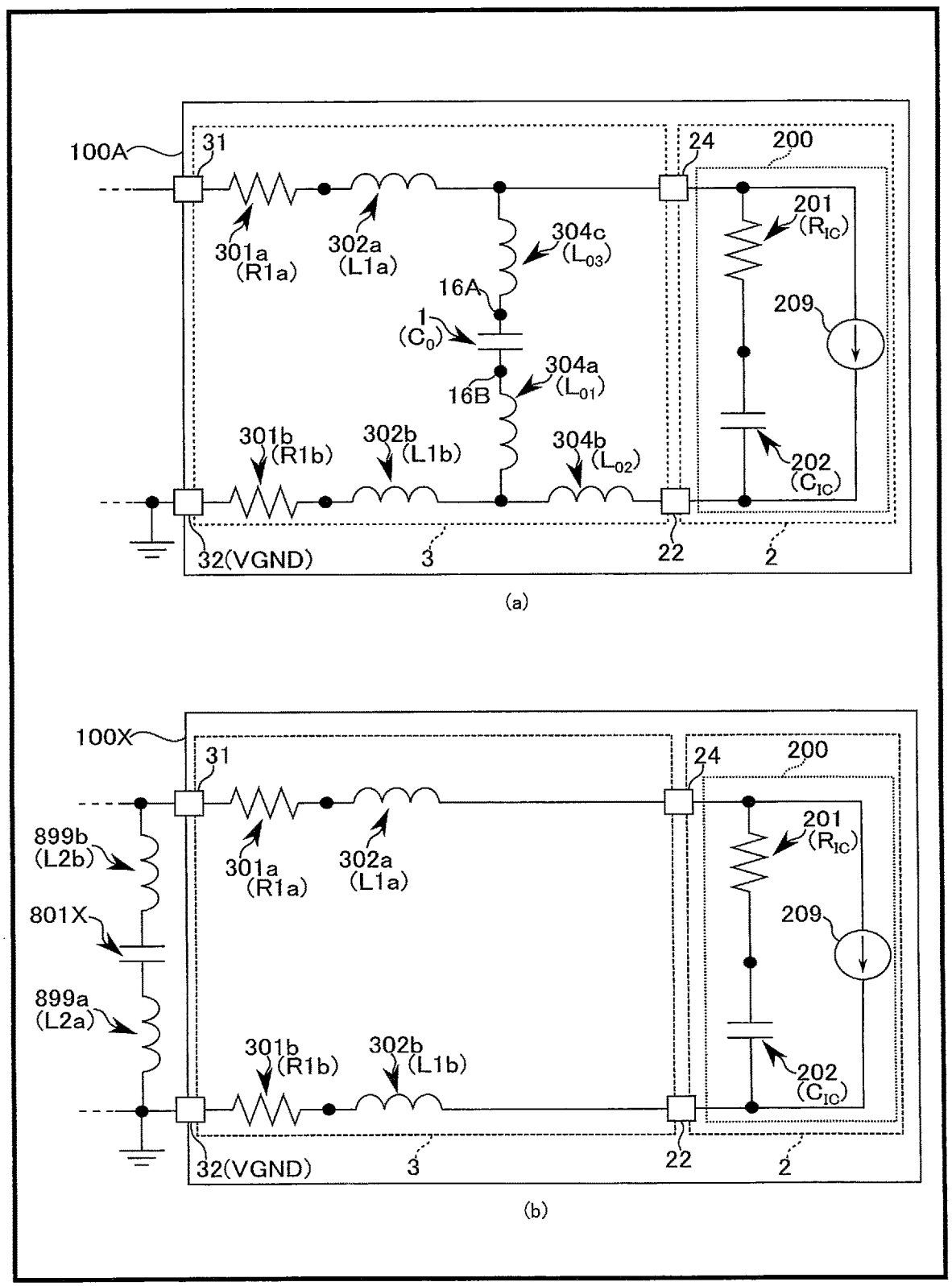
FIG. 9 is an equivalent circuit diagram illustrating a configuration example of the semiconductor device according to the first embodiment.

FIG. 9 is an equivalent circuit diagram of the semiconductor device 100A according to the present embodiment and the semiconductor device according to the comparative example. (a) of FIG. 9 illustrates an equivalent circuit diagram of the semiconductor device 100A according to the present embodiment. (b) of FIG. 9 illustrates an equivalent circuit diagram of a semiconductor device according to a comparative example.

As illustrated in (a) of FIG. 9, in the IC chip (here, also referred to as the IC) 2 of the semiconductor device 100A according to the present embodiment, a certain circuit block 200 of the circuit unit 20 is connected to the certain terminal (lead) 31 via the pad 24 and is connected to the ground terminal (base) 32 via the ground pad 22.

The circuit block 200 includes a resistance component (parasitic resistance) 201 and a capacitance component (parasitic capacitance) 202. The resistance component 201 has a resistance value $R_{IC}$ of a certain magnitude. The capacitance component 202 has a capacitance value $C_{IC}$ of a magnitude. The resistance component 201 and the capacitance component 202 are connected in series between the pad 24 and the ground pad 22.

The circuit block 200 acts as a current source 209 between the terminal 31 and the ground terminal 32. The current source 209 is connected in parallel to the resistance component 201 and the capacitance component 202 between the pad 24 and the ground pad 22.

A signal path (lead, wire, and pad) connected to the terminal 31 in the package substrate 3 includes a resistance component (parasitic resistance) 301a and an inductance component (parasitic inductance) 302a. The resistance component 301a and the inductance component 302a are connected in series between the terminal 31 and the pad 24.

A signal path (base, wire, and pad) connected to the ground terminal 32 in the package substrate 3 includes a resistance component (parasitic resistance) 301b and an inductance component (parasitic inductance) 302b. The resistance component 301b and the inductance component 302b are connected in series between the ground terminal 32 and the pad 22.

The resistance component 301a has a resistance value R1a of a certain magnitude, and the resistance component 301b has a resistance value R1b of a certain magnitude. Here, it is assumed that the resistance value R1a is substantially equal to the resistance value R1b.

The inductance component 302a has an inductance value L1a of a certain magnitude, and the inductance component 302b has an inductance value L1b of a certain magnitude. Here, it is assumed that the magnitude of the inductance value L1a is substantially equal to the magnitude of the inductance value L1b.

In a case where the Si capacitor chip (also referred to as the Si capacitor here) 1 is provided on the package substrate 3 (in the package member 39) together with the IC chip 2 as in the present embodiment, the Si capacitor 1 is connected between the terminal 31 and the IC chip 2.

The Si capacitor 1 is connected in parallel to the circuit block 200 between the terminal 31 and the ground terminal 32. The node 16A of the Si capacitor 1 is electrically connected to the pad 24 and the terminal 31. A node (ground node) 16B of the Si capacitor 1 is electrically connected to the ground pad 22 and the ground terminal 32.

The semiconductor device 100A includes an inductance component (parasitic inductance) 304 (304a and 304c) caused by the connection of the Si capacitor 1 with respect to the IC chip 2 and the package substrate 3.

The inductance component 304a is generated between the ground terminal 32 (and the pad 22) and the node 16B of the Si capacitor 1. The inductance component 304c occurs between the terminal 31 (and the pad 24) and the node 16A of the Si capacitor 1.

The inductance components 304a and 304c are connected in parallel to the circuit block 200 between the terminal 31 and the ground terminal 32.

The semiconductor device 100A includes an inductance component (parasitic inductance) 304b caused by the connection between the IC chip 2 and the package substrate 3.

The inductance component 304b is connected in series between the circuit block 200 and the ground terminal 32.

The inductance component 304a has an inductance value $L_{O1}$ of a certain magnitude. The inductance component 304b has an inductance value $L_{O2}$ of a certain magnitude. The inductance component 304c has an inductance value $L_{O3}$ of a certain magnitude.

In the present embodiment, each of the inductance components 304 is generated by a wire connected to the Si capacitor chip 1 and the IC chip 2.

The inductance component 304a ($L_{O1}$) is caused by the wire 53 for connecting the node 16B of the Si capacitor chip 1 and the base 32 as the ground terminal. The inductance component 304b ($L_{O2}$) is caused by the wire 52 for connecting the ground pad 22 of the IC chip 2 and the base 32. The inductance component 304c ($L_{O3}$) is caused by the wire 53 for connecting the pad 21 of the IC chip 2 and the node 16A of the Si capacitor chip 1.

In the present embodiment, the node 16B of the Si capacitor chip 1 is electrically connected to the base 32 immediately below the Si capacitor chip 1.

When the semiconductor device 100A according to the present embodiment is compared with a semiconductor device having a configuration in which the ground voltage VGND is supplied to the Si capacitor chip 1 and the IC chip 2 via a lead (here, referred to as a ground lead for differentiation), the length of the wire 54 connecting the node 16B and the base 32 in the present embodiment can be shorter than the length of the wire connecting the node 16B and the lead.

Accordingly, the semiconductor device 100A according to the present embodiment can reduce the inductance component (for example, the inductance value $L_{O1}$ of the inductance component 304a) between the node 16B of the Si capacitor chip 1 and the ground terminal.

In addition, when the semiconductor device 100A according to the present embodiment is compared with a semiconductor device having a configuration in which the ground voltage VGND is supplied to the Si capacitor chip 1 and the IC chip 2 via the ground lead, the length of the wire 52 connecting the ground pad 22 and the base 32 can be shorter than the length of the wire connecting the ground pad 22 and the ground lead.

Accordingly, the semiconductor device 100A according to the present embodiment can reduce an inductance component (for example, the inductance value $L_{O2}$ of the inductance component 304b) between the ground pad 22 of the IC chip 2 and the ground terminal.

For example, the inductance value $L_{O1}$ of the inductance component 304a and the inductance value $L_{O2}$ of the inductance component 304b are smaller than the inductance value L1 of the inductance component 302 of the package substrate 3.

As a result, the semiconductor device 100A according to the present embodiment can reduce noise caused by wires connected to the chips 1 and 2.

For example, the circuit configuration of the comparative example of (b) of FIG. 9 corresponds to a structure in which a capacitor 801X is provided outside a semiconductor device 100X, like the semiconductor device 800 and the capacitor 801 of FIG. 1.

In the semiconductor device 100X, an IC (IC chip) 2X has substantially the same configuration as the IC 2 in (a) of FIG. 9. The semiconductor device 100X does not include a capacitor on the package substrate 3. The capacitor 801X is connected to the terminal (leads 31) and the ground terminal (for example, the base 32) outside the semiconductor device 100X (outside the package substrate 3).

For example, inductance components 899a and 899b caused by the capacitor 801X are generated between the semiconductor device 100X and the capacitor 801X. The inductance component 899a having a certain inductance value L2a is generated between the ground terminal 32 and one node of the capacitor 801X. The inductance component 899b having a certain inductance value L2b is generated between the terminal 31 and the other node of the capacitor 801X. Here, it is assumed that the magnitude of the inductance value L2a is substantially equal to the magnitude of the inductance value L2b. The inductance component 899a is caused by the ground bus 92 and the substrate member of the printed wiring board 900. The inductance component 899b is caused by the signal bus 91 and the substrate member of the printed wiring board 900. For example, the magnitude of the inductance value L2 (L2a and L2b) depends on the lengths of the buses 91 and 92. The inductance value L2 is larger than the inductance values $L_{O1}$ and $L_{O2}$. For example, the inductance value L2 is larger than the inductance value L1.

As described above, in the semiconductor device 100A according to the present embodiment, the Si capacitor is provided between the terminal of the package substrate 3 and the IC chip 2 (inside the package substrate 3).

Accordingly, the semiconductor device 100A according to the present embodiment can reduce the inductance component caused by the connection of the capacitor as compared with the semiconductor device 100X (and the capacitor 801X) according to the comparative example from the circuit viewpoint.

(d) Summary

In addition, in the semiconductor device 100 (100A) according to the present embodiment, the Si capacitor chip 1 as a passive element is provided on the package substrate 3 (in the package member 39) together with the IC chip 2.

As a result, the semiconductor device 100 according to the present embodiment can reduce the distance of the connection path (signal path) between the Si capacitor chip 1 and the IC chip 2. Therefore, the semiconductor device 100 according to the present embodiment can reduce the parasitic impedance between the Si capacitor chip 1 and the IC chip 2.

For example, in the semiconductor device 100 according to the present embodiment, the node 16B of the Si capacitor chip 1 is electrically connected to the base 32 in common with the ground pad 22 of the IC chip 2. A ground voltage VGND is applied to the base 32.

As a result, the semiconductor device 100 according to the present embodiment can reduce the parasitic impedance on the ground side of the Si capacitor chip 1.

Accordingly, the semiconductor device 100 according to the present embodiment can improve EMC characteristics.

As described above, the semiconductor device according to the present embodiment can improve the characteristics of the semiconductor device.

(2) Second Embodiment

A semiconductor device according to the second embodiment will be described with reference to FIG. 10.

Figure 10:
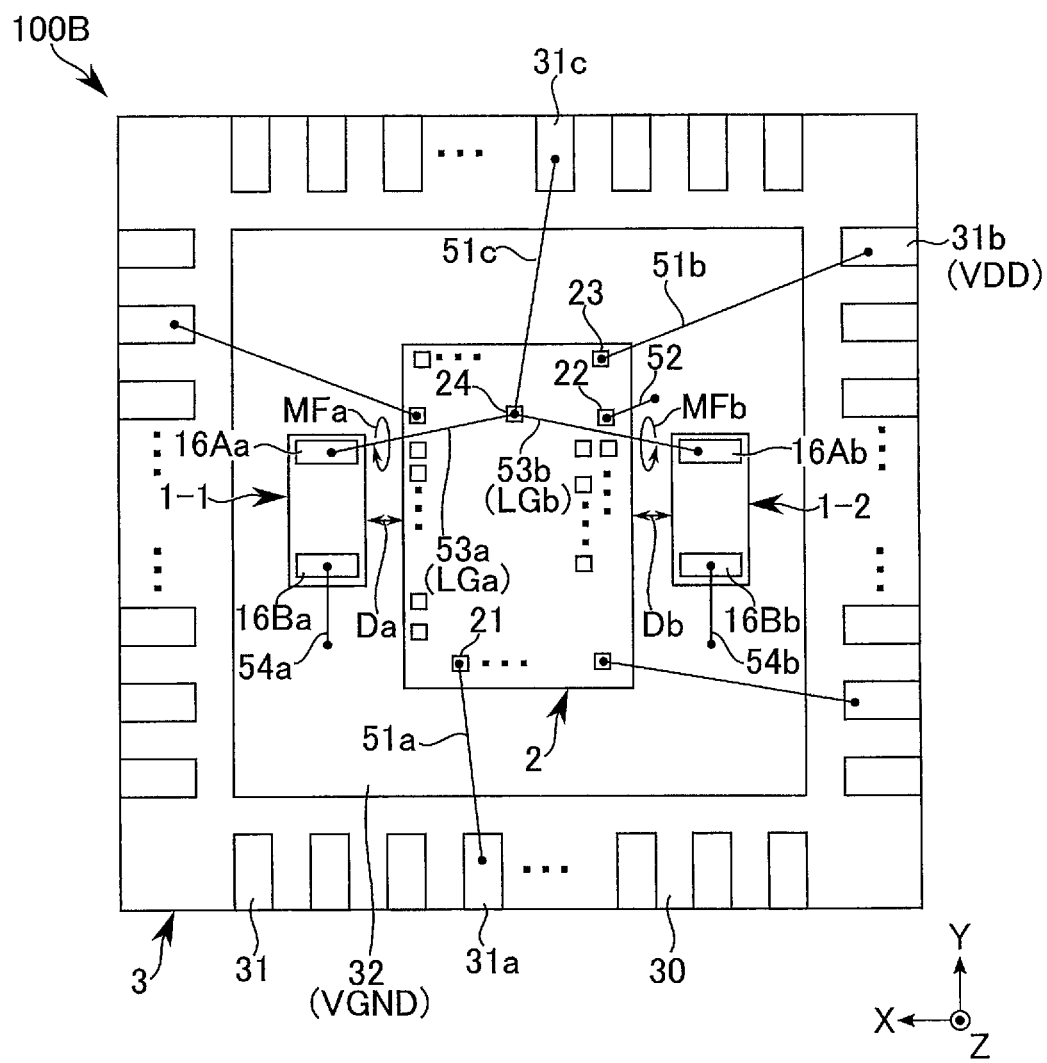
FIG. 10 is a top view illustrating a configuration example of a semiconductor device according to a second embodiment.

FIG. 10 is a top view illustrating a configuration example of a semiconductor device 100B according to the present embodiment.

As illustrated in FIG. 10, the semiconductor device 100B according to the present embodiment includes a plurality of Si capacitor chips 1 (1a and 1b). In the present embodiment, the plurality of Si capacitor chips 1 is disposed on a package substrate 3 by a layout that is bilaterally symmetric (or vertically symmetric) with respect to an IC chip 2.

The plurality of Si capacitor chips 1a and 1b is provided on a base 32 (mount portion 320) of the package substrate 3. The Si capacitor chip 1a is disposed on one end side of the IC chip 2 in the X direction. The Si capacitor chip 1b is disposed on the other end side of the IC chip 2 in the X direction. As described above, the IC chip 2 is disposed between the two Si capacitor chips 1a and 1b in the X direction.

The Si capacitor chip 1a is adjacent to the IC chip 2 in the X direction with an interval Da between the Si capacitor chip 1a and the IC chip 2. The Si capacitor chip 1b is adjacent to the IC chip 2 in the X direction with an interval Db between the Si capacitor chip 1b and the IC chip 2. For example, the size of the interval Db is substantially the same as the size of the interval Da.

The plurality of Si capacitor chips 1a and 1b is commonly connected to a certain pad 24 of the IC chip 2.

A node 16Aa of the Si capacitor chip 1a is electrically connected to the pad 24 of the IC chip 2 via a wire 53a. A node 16Ba of the Si capacitor chip 1a is electrically connected to the base 32 via a wire 54a.

A node 16Ab of the Si capacitor chip 1b is electrically connected to the pad 24 of the IC chip 2 via a wire 53b. A node 16Bb of the Si capacitor chip 1b is electrically connected to the base 32 via a wire 54b.

It is desirable that the inductance value of the wire 54a is substantially the same as the inductance value of the wire 54b. Therefore, it is desirable that a length LGa of the wire 54a is substantially the same as a length LGb of the wire 54b.

When the current flows between the pad 24 and the nodes 16Aa and 16Ab, magnetic fields MFa and MFb are generated in the wires 54a and 54b, respectively. The layout of the Si capacitor chips 1a and 1b with respect to the IC chip 2 and/or the connection relationship between the Si capacitor chips 1a and 1b and the IC chip 2 are designed in a manner that the influence of the magnetic field MFa on the IC chip 2 (pad 24) is offset by the magnetic field MFb.

For example, the two Si capacitor chips 1a and 1b are disposed on the package substrate 3 (base 32) with the pad 24 to which the Si capacitor chips 1a and 1b are connected as the center (base point) with respect to the IC chip 2 in a symmetrical layout.

For example, two Si capacitor chips 1 are connected to one pad 24 in a manner that the orientation of the magnetic field MFb of the wire 54b is opposite to the orientation of the magnetic field MFa of the wire 54a.

Note that FIG. 10 illustrates an example in which two Si capacitor chips 1a and 1b are provided on one package substrate 3. However, three or more Si capacitor chips 1 may be provided on one package substrate 3.

As described above, the semiconductor device 100B according to the present embodiment can mitigate the influence of the magnetic field generated in the wire 54 connecting the Si capacitor chip 1 and the IC chip 2. Accordingly, the semiconductor device 100B according to the present embodiment can reduce noise generated in the IC chip 2.

As described above, the semiconductor device 100B according to the present embodiment can obtain substantially the same effects as those of the semiconductor device according to the first embodiment.

(3) Third Embodiment

A semiconductor device according to the third embodiment will be described with reference to FIGS. 11 and 12.

FIG. 11 is a top view illustrating a configuration example of a semiconductor device 100C according to the present embodiment. FIG. 12 is a cross-sectional view schematically illustrating a cross-sectional structure of the semiconductor device 100C according to the present embodiment, and illustrates a cross section taken along line XII-XII of FIG. 11.

Figure 12:
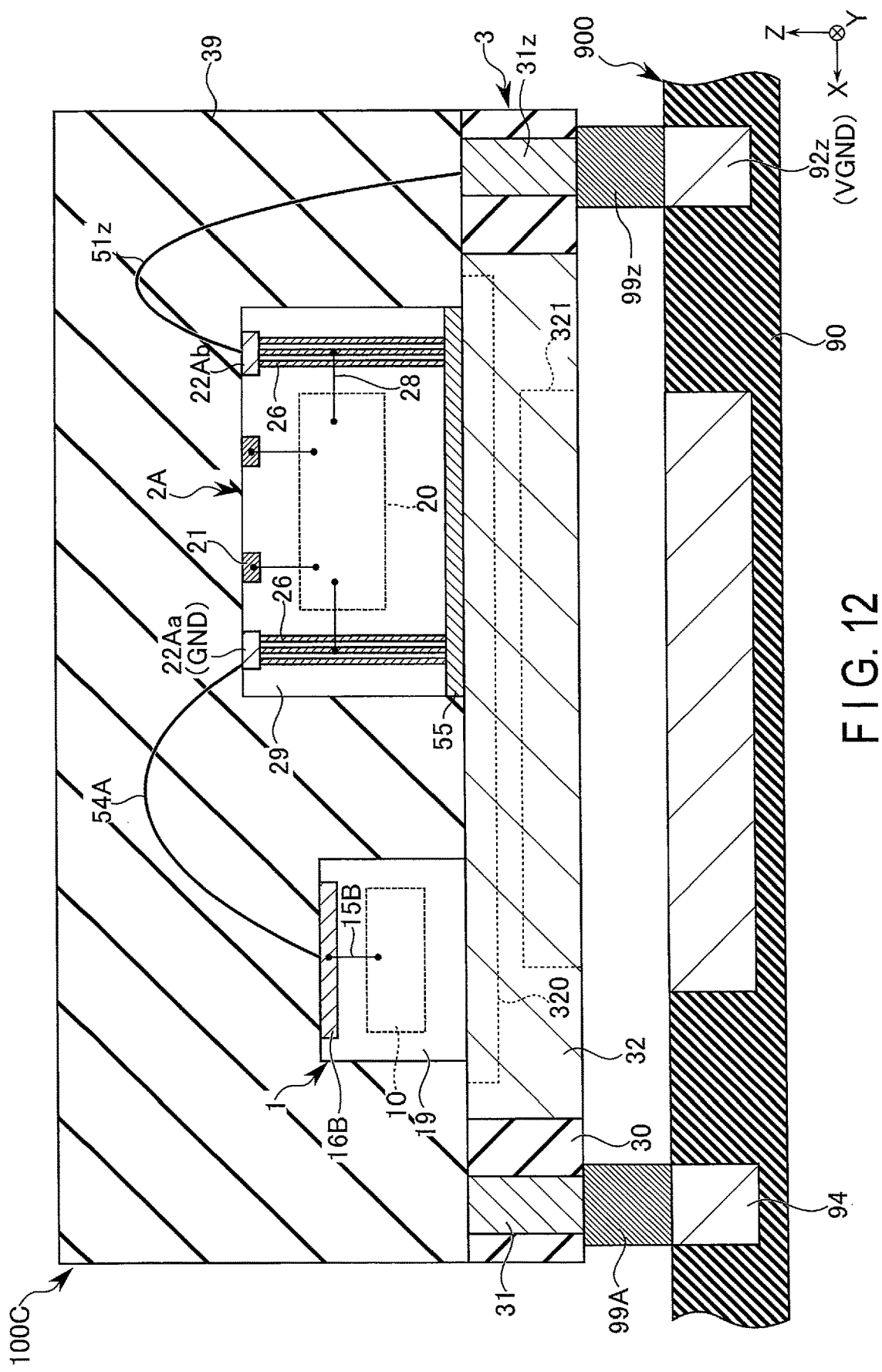
FIG. 12 is a cross-sectional view taken along line XII-XII of FIG. 11.

As illustrated in FIGS. 11 and 12, in the semiconductor device 100C according to the present embodiment, the ground voltage VGND is applied to an Si capacitor chip 1 via an IC chip 2A.

In the present embodiment, the IC chip 2A includes a plurality of through silicon vias (TSVs) 26. The TSVs (also referred to as through electrodes) 26 extend from the upper surface (front surface) toward the lower surface (back surface) of the IC chip 2A in the Z direction. The upper surface of the IC chip 2A is a surface on which various pads 21, 22A, 23, and 24 of the IC chip 2A are provided. The lower surface of the IC chip 2A is a surface (surface on the side of a package substrate 3) facing the upper surface of the IC chip 2A in the Z direction.

The TSVs 26 are electrically connected to corresponding pads 22A (22Aa and 22Ab) among the plurality of pads. The TSVs 26 are electrically connected to a circuit unit 20 in the IC chip 2A via, for example, an internal interconnect (multilayer interconnect) 28. However, in some cases, any TSV among the plurality of TSVs 26 is not connected to the circuit unit 20.

Note that the size (area) of the pads 22A connected to the TSVs 26 may be different from the size of the pad 21 not connected to the TSVs 26.

A conductive layer 55 is provided between the IC chip 2A and a base 32. The conductive layer 55 is, for example, a layer formed using a conductive paste. The conductive layer 55 is electrically connected to the TSVs 26. Note that an insulating layer (not illustrated) may be provided between the conductive layer 55 and the lower surface of the IC chip 2A. Note that, in some cases, an insulating layer (not illustrated) may be provided between the conductive layer 55 and the base 32.

As described above, the ends (upper ends, top) of the TSVs 26 on the upper surface side of the IC chip 2A are electrically connected to the pads 22A, and the ends (lower ends, bottom) of the TSVs 26 on the lower surface side of the IC chip 2A are electrically connected to the conductive layer 55. As a result, the TSVs 26 penetrating the IC chip 2A electrically connects the pads 22A on the upper surface side of the IC chip 2A to the conductive layer 55 on the lower surface side of the IC chip 2A.

The pads 22A (22Aa and 22Ab) on the upper surface of the IC chip 2A are electrically connected to the ground interconnect GND in the IC chip 2A.

In the present embodiment, for example, the ground voltage VGND is supplied from a ground path 92z to the pad 22Ab via a wire 51z, a lead 31z, and a contact portion 99z. The ground voltage VGND is supplied from the pad 22Ab to the pad 22Aa via the ground interconnect GND in the IC chip 2A.

However, the ground voltage VGND may be supplied from the base 32 to the pads 22Aa and 22Ab via the TSVs 26 and the conductive layer 55.

A node (ground node) 16B of the Si capacitor chip 1 is electrically connected to the pad 22Aa of the IC chip 2A via a wire 54A.

As described above, the ground voltage VGND is supplied from the IC chip 2A to the Si capacitor chip 1 via the pads 22A connected to the TSVs 26 of the IC chip 2A and the TSVs 26 (and the conductive layer 55).

As described above, in the semiconductor device 100C according to the present embodiment, the node 16B of the Si capacitor chip 1 is electrically connected to the ground pads 22A (ground interconnect GND) of the IC chip 2A.

As a result, the semiconductor device 100C according to the present embodiment can further improve the EMC characteristics.

Therefore, the semiconductor device according to the present embodiment can improve the characteristics of the semiconductor device.

(4) Fourth Embodiment

A semiconductor device according to the fourth embodiment will be described with reference to FIGS. 13 to 15.

FIG. 13 is a top view illustrating a configuration example of a semiconductor device 100D (100Da and 100Db) according to the present embodiment. FIG. 14 is a cross-sectional view schematically illustrating a cross-sectional structure of the semiconductor device 100D according to the present embodiment, and illustrates a cross section taken along line XIV-XIV of FIG. 13.

Figure 14:
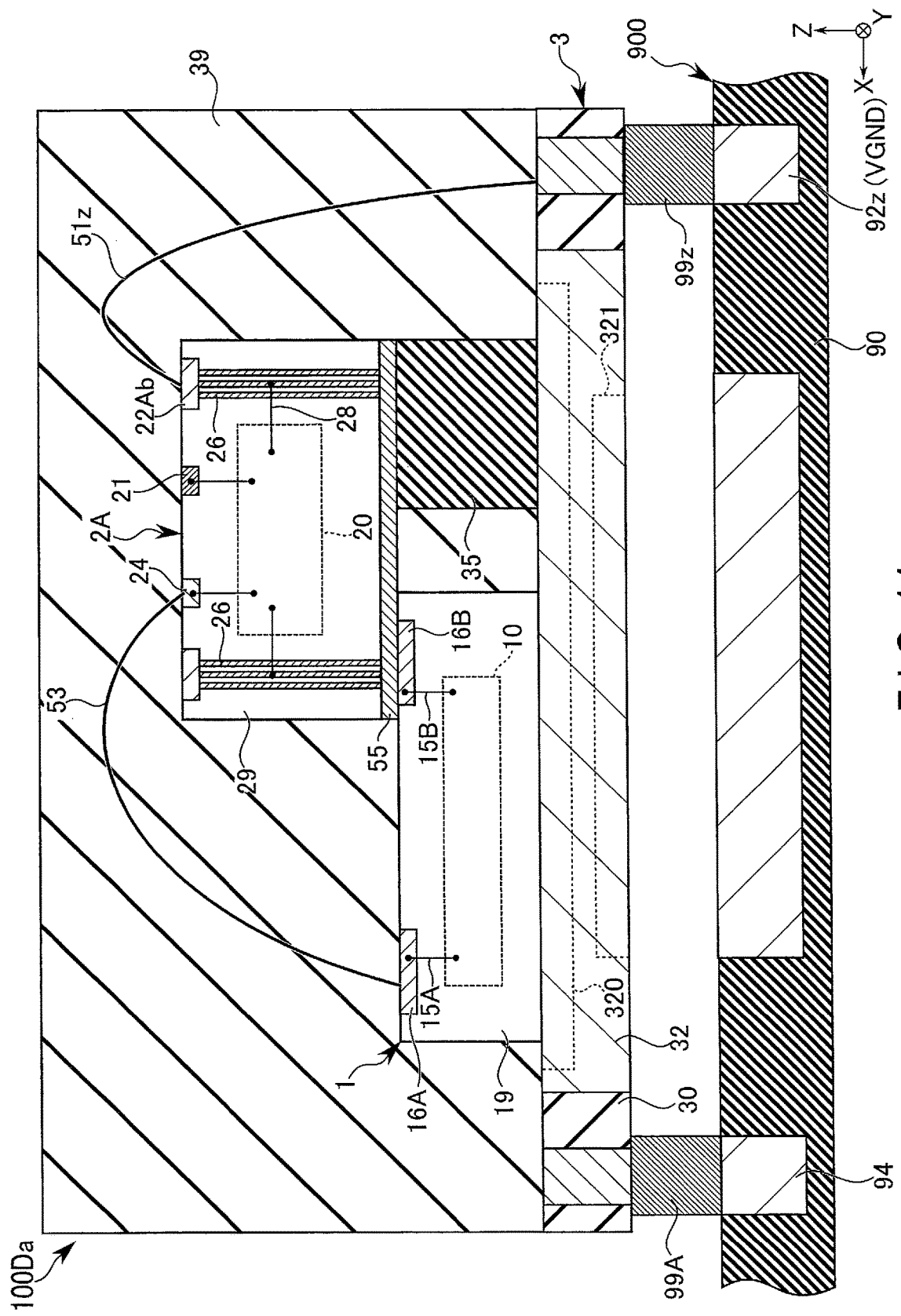
FIG. 14 is a cross-sectional view taken along line XIV-XIV of FIG. 13.

As illustrated in FIGS. 13 and 14, in the semiconductor device 100Da according to the present embodiment, an IC chip 2A is partially stacked on an Si capacitor chip 1.

The IC chip 2A is provided above the Si capacitor chip 1 and a spacer (also referred to as a spacer layer or a dummy interposer) 35 in the Z direction. The spacer 35 is provided on a base 32. The spacer 35 is, for example, an insulator. However, the spacer 35 may be a conductor.

As in the third embodiment, a ground pad 22Ab is electrically connected to a lead 31z via a wire 51z. The ground voltage VGND is supplied to the ground pad 22Ab.

The ground pad 22Ab is electrically connected to the conductive layer 55 on the lower surface side of the IC chip 2A via TSVs 26.

The conductive layer 55 extends continuously from a position below the ground pad 22Ab to a node (ground node) 16B of the Si capacitor chip 1.

An end of the Si capacitor chip 1 on the ground node 16B side is provided between the IC chip 2A and the base 32.

The ground node 16B vertically and partially overlaps the IC chip 2A in the Z direction via the conductive layer 55. The ground node 16B is electrically connected to the TSVs 26 and the pad 22Ab of the IC chip 2A via the conductive layer 55.

As a result, the ground voltage VGND is supplied from the stacked IC chip 2A to the Si capacitor chip 1.

Note that, when the ground voltage VGND is applied from the base 32 to the IC chip 2A, a spacer 36 may be a conductive member (for example, an interconnect substrate having a signal path made of metal). As a result, the ground voltage VGND applied to the base 32 is supplied to the conductive layer 55, the TSVs 26, the pads (ground interconnect) 22A, and the ground node 16B via the conductive spacer 36.

In addition, the node 16B of the Si capacitor chip 1 may be directly connected to the TSVs 26 without interposing the conductive layer 55.

FIG. 15 is a top view illustrating a modification of the semiconductor device 100D according to the present embodiment.

As illustrated in FIG. 15, in the semiconductor device 100Db, both a node 16A and the ground node 16B of the Si capacitor chip may be provided below the IC chip 2A.

In this case, an insulating layer (not illustrated) is provided between the node 16A and the lower surface of the IC chip 2A. As a result, the node 16A is electrically separated from the conductive layer 55 or the TSVs 26 on the lower surface of the IC chip 2A. Note that the node 16A may be electrically connected to corresponding pads 21, 23, and 24 via the TSV (and the conductive layer).

In the configuration example of FIG. 15, the ground node 16B is electrically connected to the conductive layer 55 and the TSVs 26 as in the examples of FIGS. 13 and 14.

When the TSVs 26 are used for the IC chip 2A as in the semiconductor device 100D according to the present embodiment, noise generated in the IC chip 2A can be reduced.

Furthermore, the semiconductor device 100D according to the present embodiment can reduce the area of a package substrate 3 (and the semiconductor device) in the X-Y plane.

As described above, the semiconductor device according to the present embodiment can improve the characteristics of the semiconductor device.

(5) Fifth Embodiment

A semiconductor device according to the fifth embodiment will be described with reference to FIGS. 16 and 17.

Figure 16:
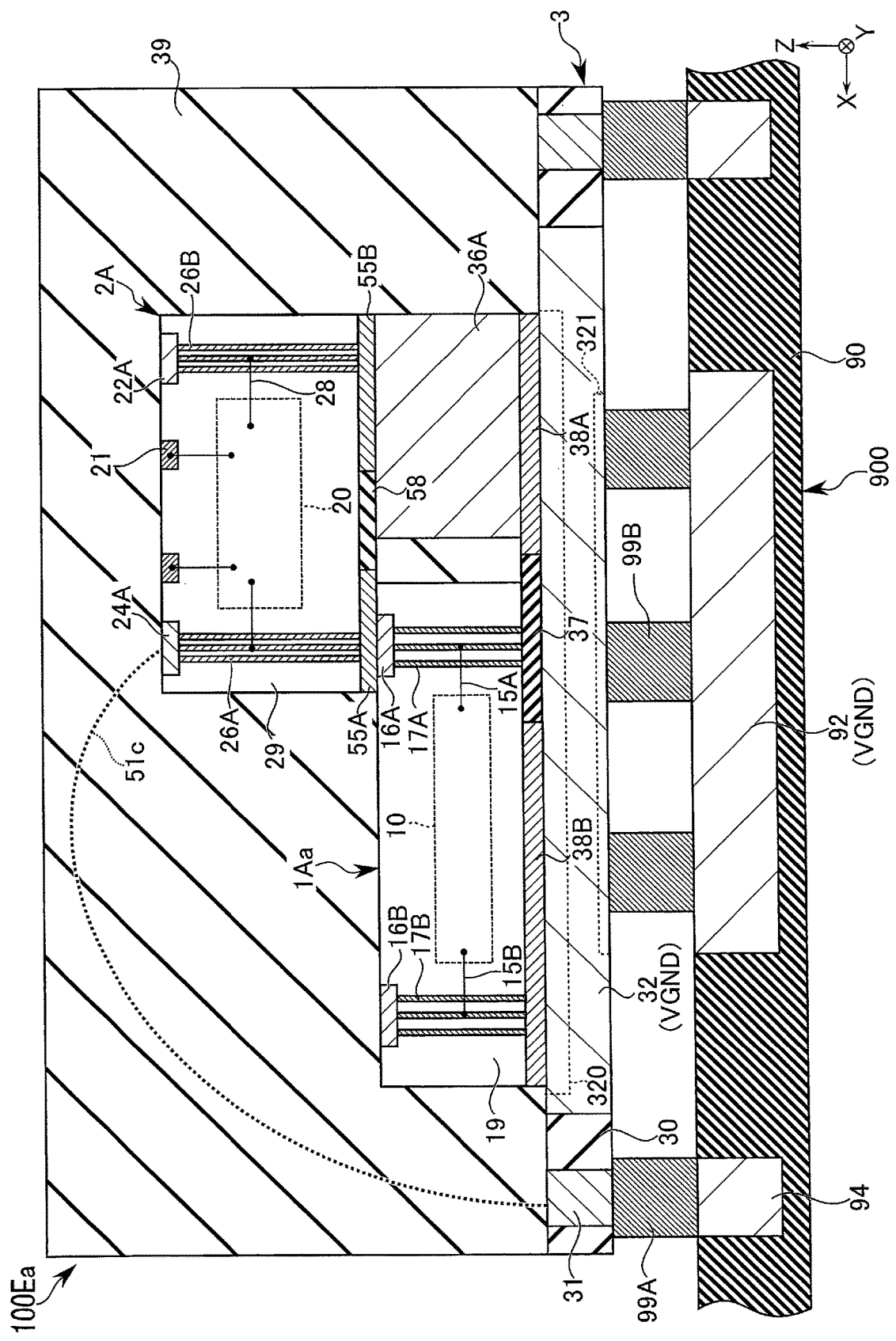
FIGS. 16 and 17 are cross-sectional views illustrating a configuration example of a semiconductor device according to a fifth embodiment.
Figure 17:
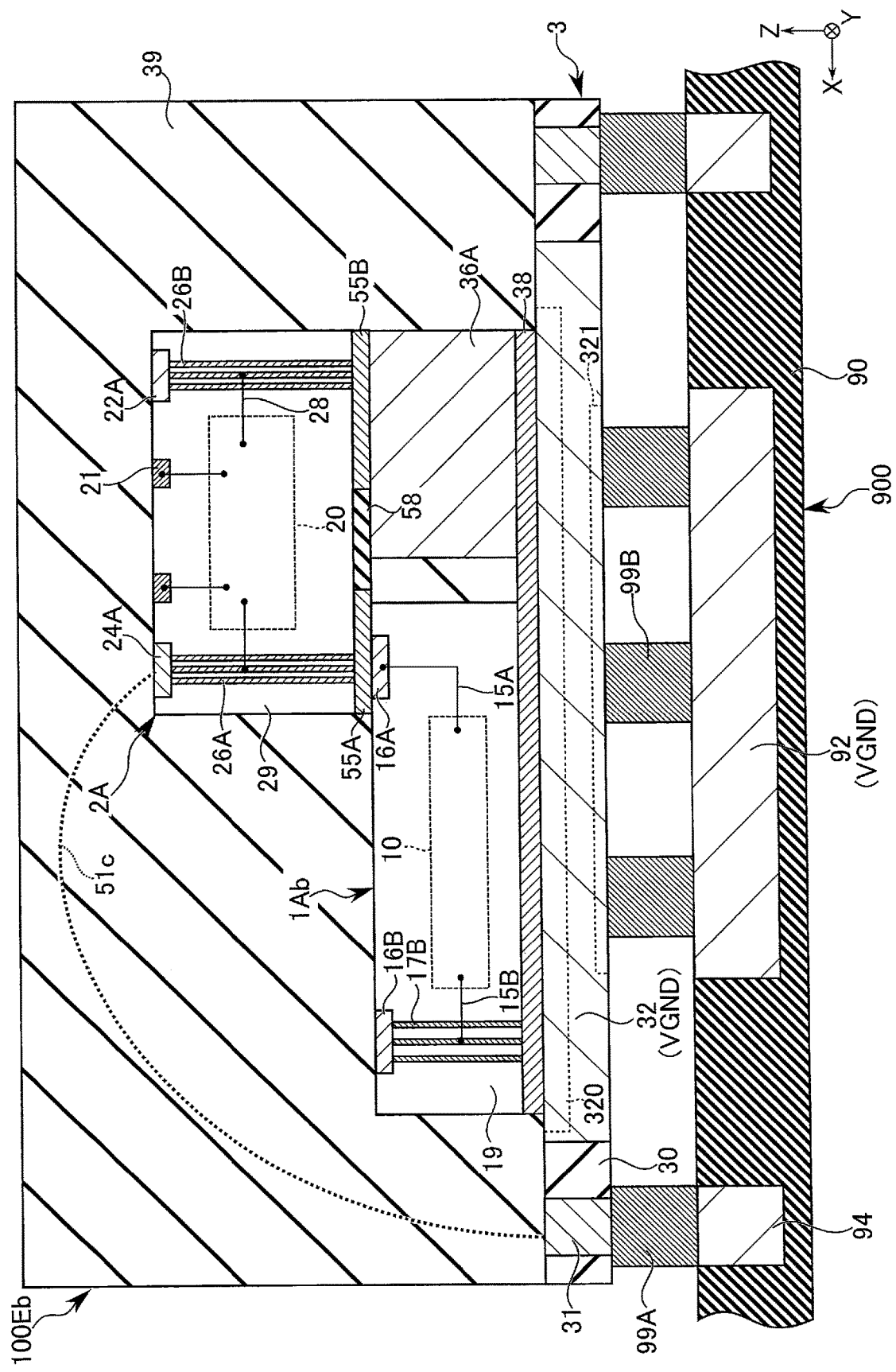

FIGS. 16 and 17 are cross-sectional views schematically illustrating a cross-sectional structure of a semiconductor device 100E (100Ea and 100Eb) according to the present embodiment. For example, each of FIGS. 16 and 17 illustrates a cross section along the X direction of the semiconductor device 100E according to the present embodiment.

As illustrated in FIG. 16, in the semiconductor device 100Ea according to the present embodiment, an Si capacitor chip 1Aa includes TSVs 17 (17A and 17B).

The TSVs 17 extend in the Z direction between the upper surface and the lower surface of the Si capacitor chip 1Aa in the Z direction.

The ends (upper ends, top) of the TSVs 17A on the upper surface side of the Si capacitor chip 1Aa are electrically connected to a node 16A. The upper ends of the TSVs 17B are electrically connected to a node (ground node) 16B.

The TSVs 17 (17A and 17B) are electrically connected to a capacitor unit 10 via an internal interconnect 15 (15A and 15B) in the Si capacitor chip 1Aa.

An insulating layer 37 is provided between the lower surface of the Si capacitor chip 1Aa and a base 32 below the node 16A. The ends (lower ends, bottom) of the TSVs 17A on the lower surface side of Si capacitor chip 1Aa is in contact with the insulating layer 37. As a result, TSVs 17A are electrically separated from the base 32 by the insulating layer 37. Note that the opening (gap) may be provided between the lower ends of the TSVs 17 and the base 32 without providing the insulating layer 37.

A conductive layer (for example, a conductive paste layer) 55A is provided on the node 16A of the Si capacitor chip 1Aa. The node 16A is electrically connected to the conductive layer 55A.

The TSVs 17A are electrically connected to the TSVs 26A in the IC chip 2A via the conductive layer 55A on the node 16A. The TSVs 26A are electrically connected to a pad 24A. The pad 24A is connected to a lead 31c via a wire 51c. A signal (or a power supply voltage) is supplied from the lead 31c to the node 16A via the TSVs 26A and the TSVs 17A.

A conductive layer 38B is provided between the lower surface of the Si capacitor chip 1Aa and the base 32 below the ground node 16B. The lower ends of the TSVs 17B are in contact with the conductive layer 38B. The TSVs 17B are electrically connected to the base 32 via the conductive layer 38B. The ground voltage VGND is supplied from the base 32 to the capacitor unit 10 via the TSVs 17B and the conductive layer 38B.

A spacer 36A is provided between the IC chip 2A and the base 32. The spacer 36A is adjacent to the Si capacitor chip 1Aa in a direction parallel to the surface of a package substrate 3. A conductive layer 38A is provided between the spacer 36A and the base 32.

A conductive layer 55B is provided between the lower surface of the IC chip 2A and a certain portion of the upper surface of the spacer 36A. The conductive layer 55B electrically connects the TSVs 26B to the spacer 36A.

The insulating layer 58 is provided between the lower surface of the IC chip 2A and a certain portion (portion not covered with the conductive layer 55B) of the upper surface of the spacer 36A in the Z direction. The insulating layer 58 is provided between the conductive layer 55A and the conductive layer 55B in a direction parallel to the surface of the package substrate 3. The insulating layer 58 electrically separates the conductive layer 55B from the conductive layer 55A. The insulating layer 58 electrically separates the conductive layer 55A from the spacer 36A.

Note that, instead of providing the insulating layer 58, an opening (gap) may be provided between the lower surface of the IC chip 2A and the spacer 36A for electrical separation of the conductive layer 55A.

The spacer 36A is a conductive layer. As a result, the ground voltage VGND is supplied from the base 32 to the circuit unit 20 and the ground pads 22A via the conductive layer 38A, the spacer 36A, the conductive layer 55B, and the TSVs 26B.

Note that the conductive layer 38B may be electrically connected to the conductive layer 38A in the depth direction or the front direction (Y direction) in FIG. 16.

As in the semiconductor device 100Eb illustrated in FIG. 17, the TSVs 17 may be provided only for one node of an Si capacitor chip 1Ab.

In FIG. 17, the TSVs 17B are connected to the ground node 16B. The TSVs 17B are electrically connected to the base 32 via the conductive layer 38 (for example, conductive paste).

As a result, the ground voltage VGND is supplied to the capacitor unit 10 via the conductive layer 38 and the TSVs 17B (and the internal interconnect 15B).

In the Si capacitor chip 1Ab, the node 16A is not connected to the TSVs 17B. The node 16A is electrically separated from the conductive layer 38. The node 16A is electrically connected to the pad 24A via the conductive layer 55A and the TSVs 26A of the IC chip 2A.

Note that each of the Si capacitor chip 1 and the IC chip 2A adjacent to each other in the X direction (or the Y direction) on the base 32 may be electrically connected to the base 32 to which the ground voltage VGND is applied via the TSVs 17 and 26 without partially stacking the IC chip 2A on the Si capacitor chip 1.

In the semiconductor device 100E of FIG. 16 or FIG. 17, when the Si capacitor chip 1A provided below the IC chip 2A does not include TSVs, the ground node 16B of the Si capacitor chip 1A may be electrically connected to the base 32 via a wire.

When the TSVs 17 are used in the Si capacitor chip 1A as in the semiconductor device 100E according to the present embodiment, noise generated in the Si capacitor chip 1A and noise generated between the Si capacitor chip 1A and the IC chip 2A can be reduced.

Therefore, the semiconductor device 100E (100Ea and 100Eb) according to the present embodiment can improve the characteristics of the semiconductor device similarly to the above-described embodiment.

(6) Sixth Embodiment

A semiconductor device according to the sixth embodiment will be described with reference to FIGS. 18 to 20.

FIG. 18 is a top view illustrating a configuration example of a semiconductor device 100F according to the present embodiment. FIG. 19 is a cross-sectional view schematically illustrating a cross-sectional structure of the semiconductor device 100F according to the present embodiment, and illustrates a cross section taken along line XIX-XIX of FIG. 18.

Figure 19:
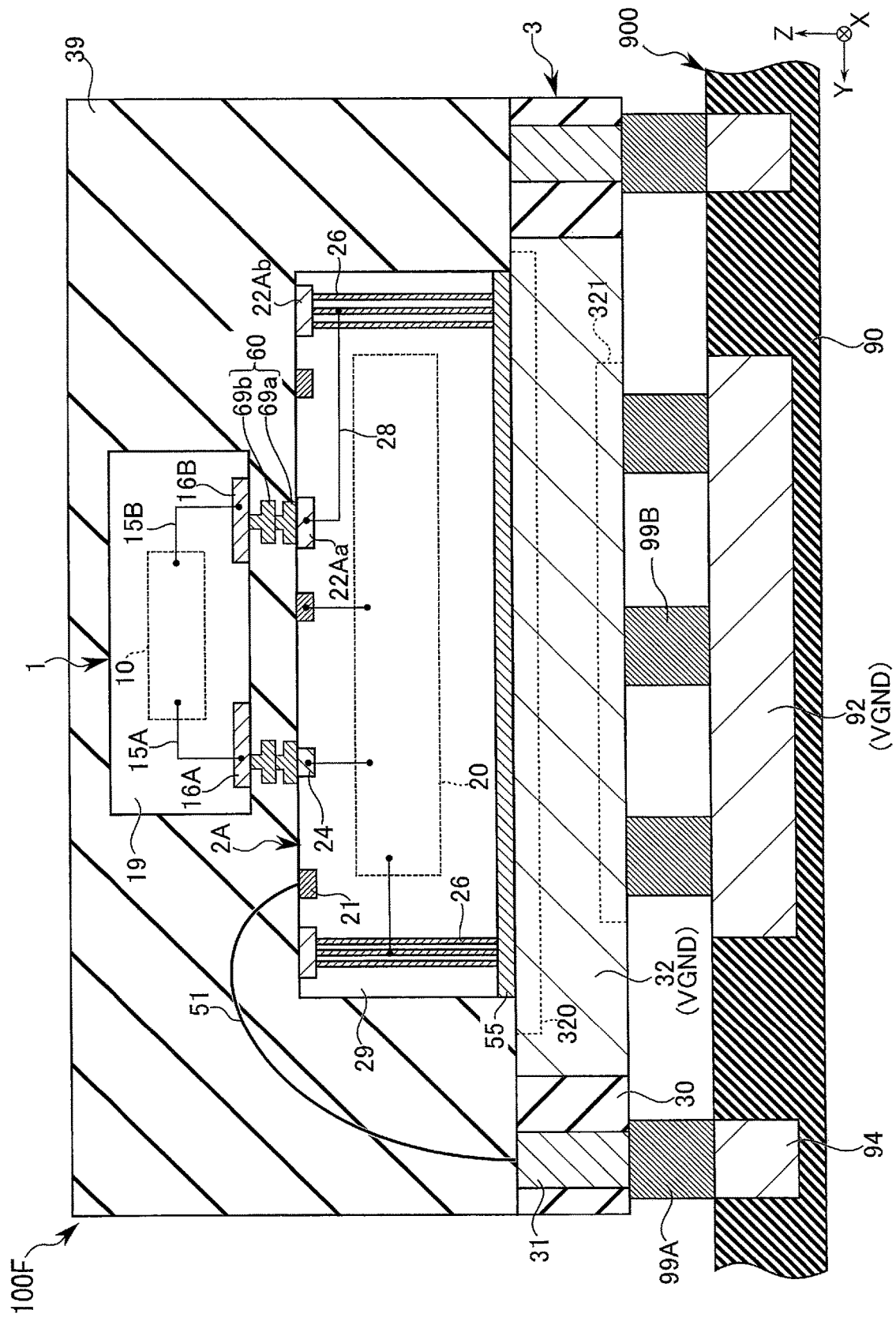
FIG. 19 is a cross-sectional view taken along line XIX-XIX of FIG. 18.

As illustrated in FIGS. 18 and 19, in the semiconductor device 100F according to the present embodiment, an Si capacitor chip 1 is provided above an IC chip 2A in the Z direction.

The Si capacitor chip 1 is stacked on the surface of the IC chip 2A on which pads 21, 22Aa, and 24 are provided in a manner that the surface of the Si capacitor chip 1 on which nodes 16A and 16B are exposed faces the side of a package substrate 3. Note that the Si capacitor chip 1 may include TSV.

Each of the nodes 16 of the Si capacitor chip 1 overlaps the corresponding pads 22Aa and 24 among the plurality of pads of the IC chip 2A in the Z direction. For example, the Si capacitor chip 1 and the IC chip 2A are designed in a manner that the nodes 16 and the pads 22Aa and 24 corresponding to each other overlap in the Z direction. However, the nodes 16 of the Si capacitor chip 1 may be electrically connected to the pads 22Aa and 24 of the IC chip 2A by a redistribution layer formed on the upper surface of the IC chip 2A by a redistribution technique.

The Si capacitor chip 1 is electrically connected to the IC chip 2A via a contact portion 60.

The contact portion 60 is provided on the pads 22Aa and 24 connected to the respective nodes 16 of the Si capacitor chip 1. For example, the contact portion 60 includes a plurality of (for example, two) stud bumps 69 (69a and 69b). The stud bump 69b is stacked on the stud bump 69a in the Z direction.

Note that, in the present embodiment, each of the nodes 16 of the Si capacitor chip 1 may be electrically connected to the corresponding pads 22Aa and 24 of the IC chip 2A by TSV.

In the present embodiment, the plurality of stacked stud bumps 69 functions as buffer members when the Si capacitor chip 1 is mounted on the IC chip 2A.

FIG. 20 is a cross-sectional process view illustrating a process of the method for manufacturing the semiconductor device 100F according to the present embodiment.

As illustrated in FIG. 20, when the Si capacitor chip 1 is mounted on the IC chip 2A, the Si capacitor chip 1 is crimped and bonded to a contact portion 60X on the IC chip 2A. The plurality of stud bumps 69a and 69b is stacked on the pads 22Aa and 24 respectively connected to nodes 16A and 16B of the Si capacitor chip 1.

By crimping the Si capacitor chip 1 against the IC chip 2A, the nodes 16A and 16B of the Si capacitor chip 1 are bonded to the pads 22Aa and 24 via the stud bumps 69a and 69b.

As a result, the Si capacitor chip 1 is disposed on the IC chip 2A and is electrically connected to the IC chip 2A via the stud bumps 69a and 69b.

At the time of crimping the Si capacitor chip 1, the stacked stud bumps 69a and 69b are settled to the IC chip 2A side by pressing for crimping.

As described above, the thickness of the Si capacitor chip 1 is relatively thin. Therefore, when the Si capacitor chip 1 is crimped to the IC chip 2A, the Si capacitor chip 1 may be cracked.

When the plurality of stud bumps 69a and 69b is stacked as in the present embodiment, the stress generated at the time of crimping is absorbed by the stud bumps 69a and 69b by the settling of the stacked stud bumps 69a and 69b. As described above, the stress applied to the Si capacitor chip 1 is mitigated by the stacked stud bumps 69a and 69b.

Accordingly, destruction of the Si capacitor chip 1 is suppressed.

Therefore, the semiconductor device 100F according to the present embodiment can improve the manufacturing yield of the semiconductor device.

In the semiconductor device 100F according to the present embodiment, the area of the package substrate 3 (and the semiconductor device 100F) on the X-Y plane can be reduced by stacking the chips 1 and 2A.

In addition, the semiconductor device according to the present embodiment can obtain substantially the same effects as those of the semiconductor device according to the above-described embodiment.

(7) Seventh Embodiment

A semiconductor device according to the seventh embodiment will be described with reference to FIGS. 21 to 23.

Figure 21:
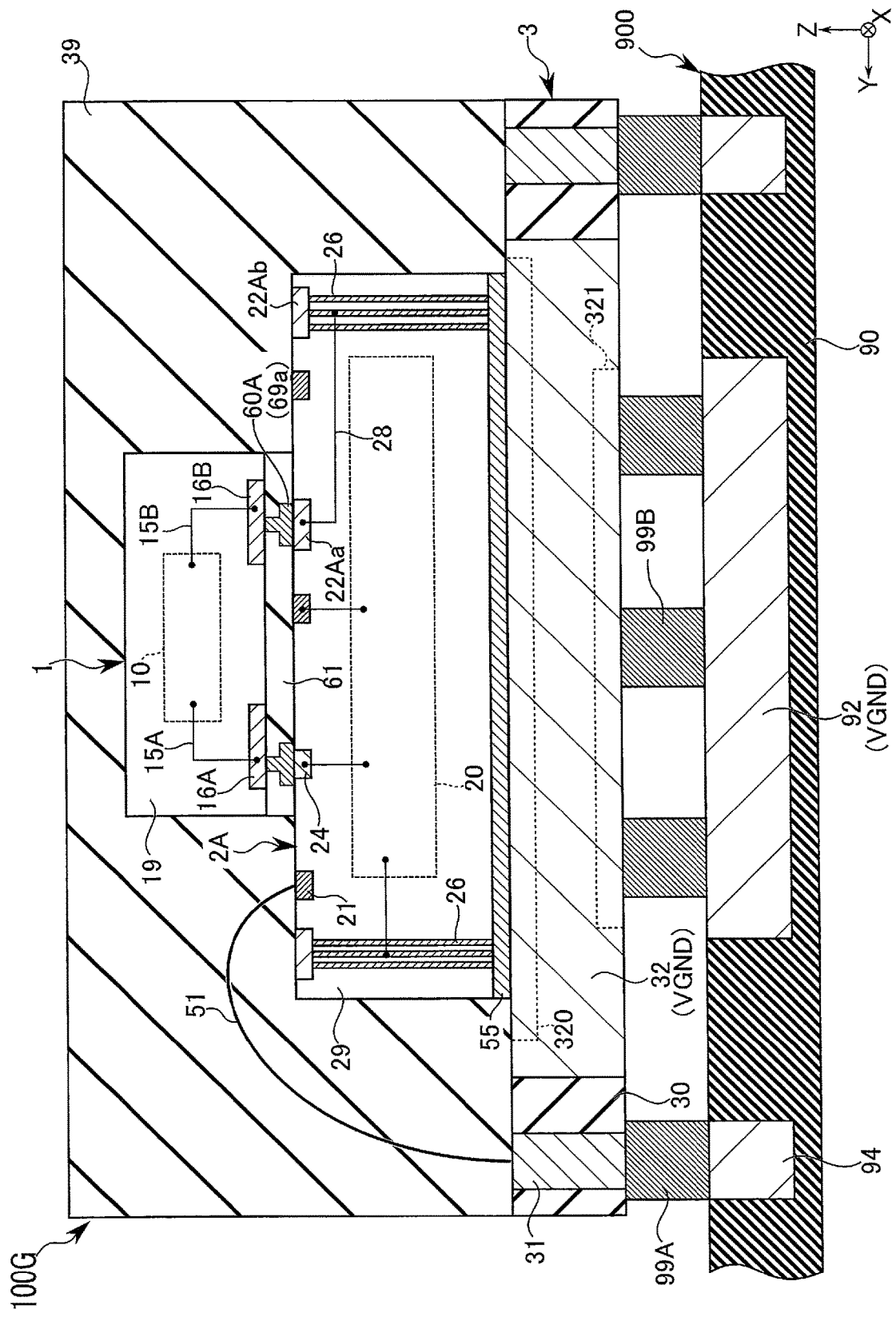
FIG. 21 is a cross-sectional view illustrating a configuration example of a semiconductor device according to a seventh embodiment.

FIG. 21 is a cross-sectional view schematically illustrating a cross-sectional structure of a semiconductor device 100G according to the present embodiment, and illustrates a cross section along the X direction of the semiconductor device 100G according to the present embodiment.

As illustrated in FIG. 21, in the semiconductor device 100G according to the present embodiment, destruction of an Si capacitor chip 1 when the Si capacitor chip 1 is crimped to an IC chip 2A may be prevented using an insulating layer (for example, an insulating film or an insulating paste).

In the present embodiment, each contact portion 60A includes one bump (for example, a stud bump) 69a. A contact portion 60A electrically connects nodes 16A and 16B of the Si capacitor chip 1 to pads 22Aa and 24 of the IC chip 2A.

An insulating layer 61 is provided between the Si capacitor chip 1 and the IC chip 2A in the Z direction. The insulating layer 61 covers the contact portion 60A. The dimension of the insulating layer 61 in the Z direction is equal to or smaller than the dimension of the contact portion 60A in the Z direction.

The insulating layer 61 functions as a buffer member when the Si capacitor chip 1 is crimped to the IC chip 2A as follows.

Figure 22:
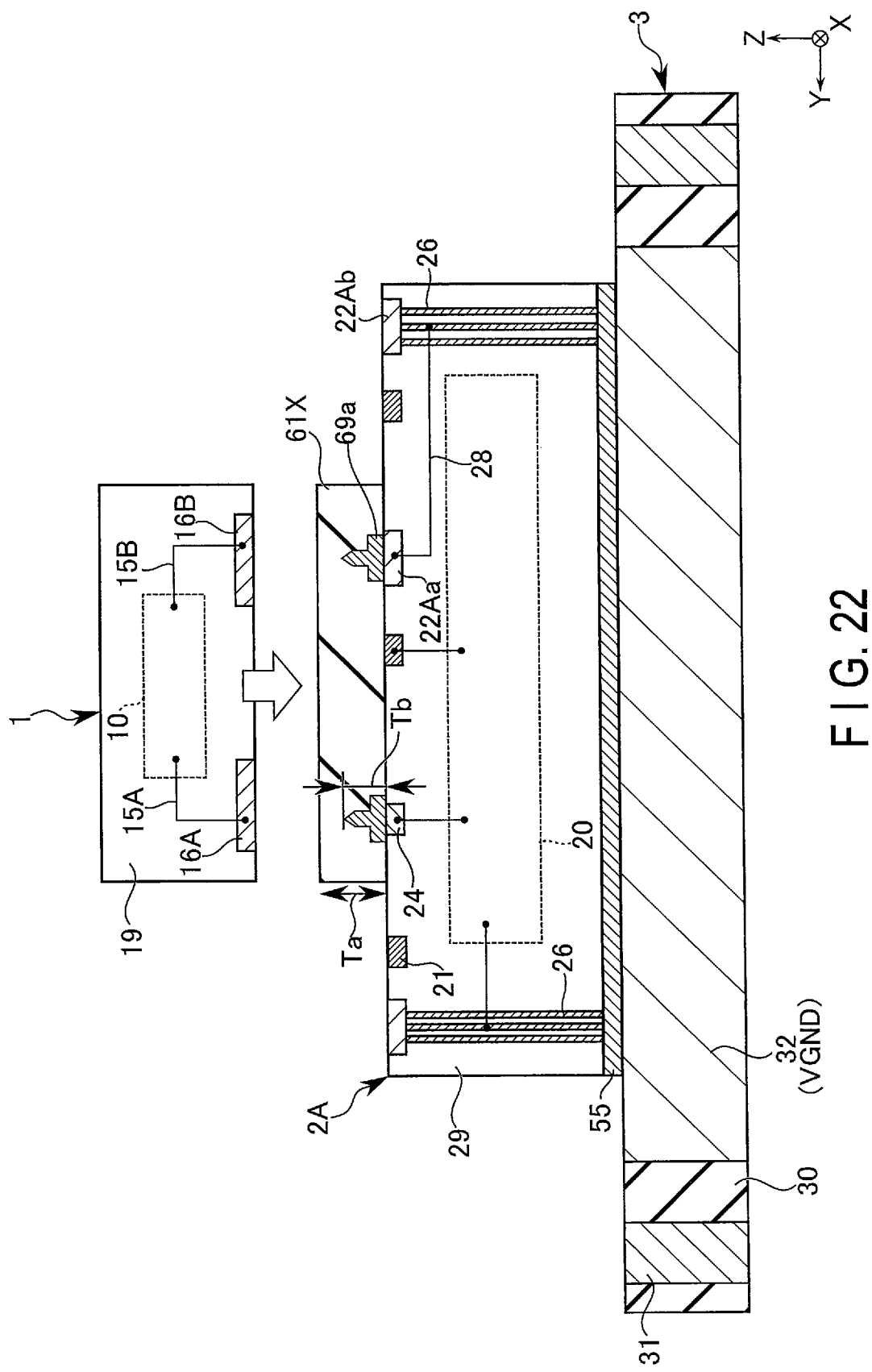
FIGS. 22 and 23 are diagrams for explaining a method for manufacturing the semiconductor device according to the seventh embodiment.

FIG. 22 is a cross-sectional process view illustrating a process of the method of manufacturing the semiconductor device 100G according to the present embodiment.

As illustrated in FIG. 22, the stud bump 69a as the contact portion 60A is formed on the pads 22Aa and 24 of the IC chip 2A.

Thereafter, a paste-like or thin-film-like insulating layer 61X is formed on the upper surface of the IC chip 2A. A dimension (thickness) Ta of the formed insulating layer 61X in the Z direction is desirably larger than a dimension Tb of the contact portion 60A in the Z direction.

After the formation of the insulating layer 61X, similarly to the example of FIG. 20, the Si capacitor chip 1 is crimped to the IC chip 2A.

For example, the Si capacitor chip 1 is pressed to the IC chip 2A until the node 16 of the Si capacitor chip 1 is bonded (electrically connected) to the stud bump 69a.

At this time, the insulating layer 61X serves as a buffer member, and the stress applied to the Si capacitor chip 1 is mitigated. Therefore, destruction (for example, cracking of the chip 1) of the Si capacitor chip 1 is suppressed.

Thereafter, for example, the paste-like insulating layer 61X is cured by light, heat, and the like. After crimping, the thickness of the insulating layer 61 is equal to or smaller than the dimension of the contact portion 60A in the Z direction.

Figure 23:
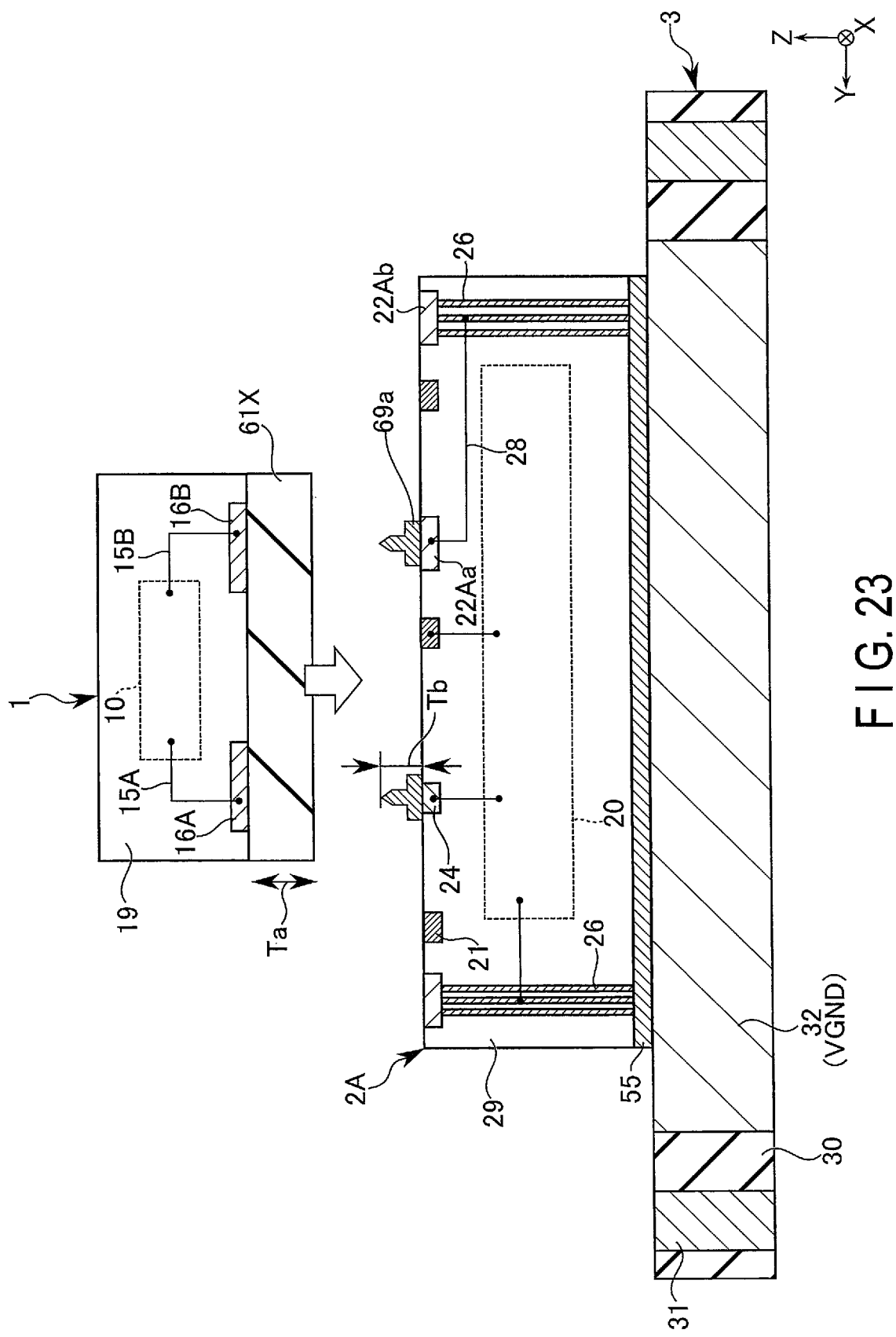

FIG. 23 is a cross-sectional process view illustrating a process of the method of manufacturing the semiconductor device 100G according to the present embodiment based on a method different from the method of FIG. 22.

As illustrated in FIG. 23, the insulating layer 61X may be formed on the surface of the Si capacitor chip 1 on which the node 16 is provided. Also, in the case of FIG. 23, the insulating layer 61X functions as a buffer member at the time of crimping the Si capacitor chip 1 to the IC chip 2A.

As described above, the semiconductor device 100G according to the present embodiment can obtain substantially the same effects as those of the semiconductor device according to the above-described embodiment.

(8) Eighth Embodiment

A semiconductor device according to the eighth embodiment will be described with reference to FIGS. 24 and 25.

Figure 24:
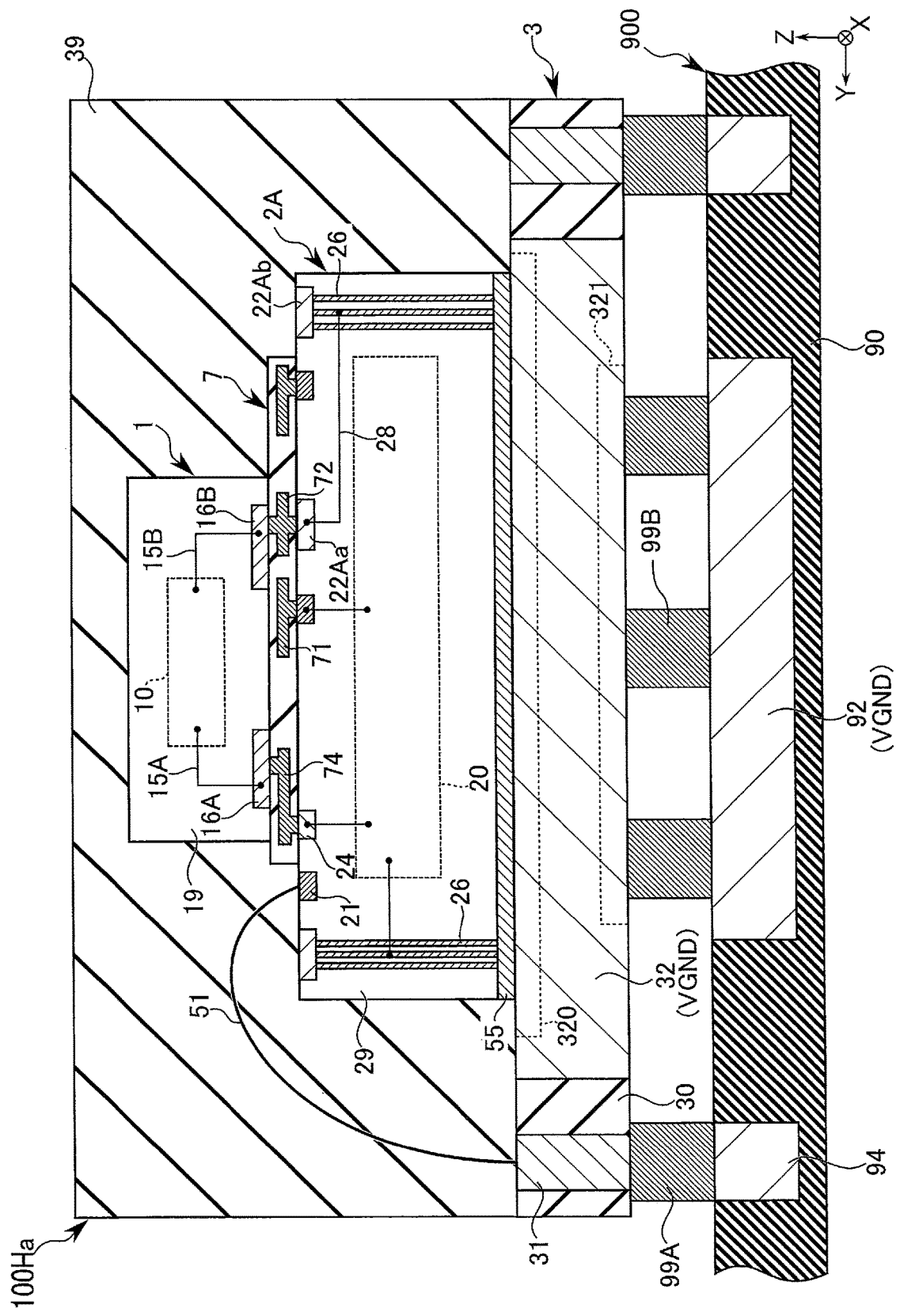
FIG. 24 is a cross-sectional view illustrating a configuration example of a semiconductor device according to an eighth embodiment.

FIG. 24 is a cross-sectional view schematically illustrating a cross-sectional structure of a semiconductor device 100Ha according to the present embodiment.

As illustrated in FIG. 24, in the semiconductor device 100Ha according to the present embodiment, the Si capacitor chip 1 may be electrically connected to the IC chip 2A by a mounting technique using a conductive sheet 7 on a package substrate 3.

The Si capacitor chip 1 is provided above the IC chip 2A in the Z direction via the conductive sheet 7. The Si capacitor chip 1 is electrically connected to the IC chip 2A via the conductive sheet 7.

The conductive sheet 7 is provided between the Si capacitor chip 1 and the IC chip 2A in the Z direction. The conductive sheet 7 includes a thin-film-like insulating layer 70 and a plurality of interconnects (and plugs) 71 (71A, 71B, and 71C) in the insulating layer 70. The plurality of interconnects 71 may have a multilayer interconnect structure in the insulating layer 70.

For example, the interconnect 71A connects a node 16A of the Si capacitor chip 1 to a pad 24 of the IC chip 2A. For example, the interconnect 71B connects a node 16B of the Si capacitor chip 1 to a ground pad 22Aa of the IC chip 2A. For example, the interconnect 71C can connect a chip (not illustrated) different from Si capacitor chip 1 to the pad of IC chip 2A in semiconductor device 100H. The interconnect 71C may electrically connect a plurality of pads 21, 22, 23, and 24 of the IC chip 2A to each other, for example.

When the conductive sheet 7 is used for connecting the Si capacitor chip 1 and the IC chip 2A as in the present embodiment, the node 16A of the Si capacitor chip 1 may be electrically connected to the pad of the IC chip 2A provided at a position not overlapping the node 16A in the Z direction by the interconnects 71 formed in the insulating layer 70.

Therefore, according to the present embodiment, it is not necessary to design the Si capacitor chip 1 and the IC chip 2A in a manner that the node 16 of the Si capacitor chip 1 overlaps the pads 22Aa and 24 of the IC chip 2A in the Z direction.

In the semiconductor device 100H according to the present embodiment, a signal path (interconnect) between the node 16 and the pads 22 and 24 can be shortened by the connection between the Si capacitor chip 1 and the IC chip 2A by the conductive sheet 7. As a result, the parasitic impedance between the node 16 and the pads 22 and 24 can be reduced. Accordingly, the semiconductor device 100H according to the present embodiment can reduce noise generated between the Si capacitor chip 1 and the IC chip 2A.

As described above, the size of the node 16 of the Si capacitor chip 1 is larger than the size of the pads 22 and 21 of the IC chip 2A. Therefore, when the Si capacitor chip 1 is connected to the IC chip 2A by the connection using the conductive sheet 7 as in the present embodiment, the degree of difficulty in alignment between the Si capacitor chip 1 and the IC chip 2A may be reduced.

Note that, instead of the conductive sheet 7, an interposer including a plurality of interconnects (and plugs) may be used.

FIG. 25 is a top view for explaining a semiconductor device 100Hb according to the present embodiment.

As illustrated in FIG. 25, the Si capacitor chip 1 and the IC chip 2A adjacent to each other in the X direction (or the Y direction) may be electrically connected by the conductive sheet 7.

The conductive sheet 7 extends between the two chips 1 and 2A in the X direction.

The node 16A of the Si capacitor chip 1 is electrically connected to the pad 24 of the IC chip 2A via the interconnects 71 in the conductive sheet 7. The node 16B of the Si capacitor chip 1 is electrically connected to the pad 22Aa of the IC chip 2A via an interconnect 72 in the conductive sheet 7.

As described above, in the semiconductor device 100H according to the present embodiment, the signal path (interconnect) between the node 16 of the Si capacitor chip 1 and the pads 22 and 24 of the IC chip 2A can be shortened by the connection using the conductive sheet 7. Accordingly, the semiconductor device 100H according to the present embodiment can improve EMC characteristics.

The semiconductor device 100H according to the present embodiment can mitigate restrictions on the design (for example, a pad/node layout) of the Si capacitor chip 1 and the IC chip 2A, and can reduce the cost of the semiconductor device 100H including the Si capacitor chip 1 and the IC chip 2A.

The semiconductor device 100H according to the present embodiment can suppress destruction of the Si capacitor chip 1 by connection using the conductive sheet 7.

In addition, the semiconductor device 100H according to the present embodiment can obtain substantially the same effects as those of the semiconductor device according to the above-described embodiment.

(9) Others

In the third to eighth embodiments, an example in which one Si capacitor chip 1 (1A) is provided on a package substrate 3 is illustrated. However, in the semiconductor device 100 according to the third to eighth embodiments, as in the second embodiment, two or more Si capacitor chips 1 (1A) may be provided on the package substrate 3 together with an IC chip 2 (2A).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
a package substrate including a base including a mount portion provided on a first surface of the package substrate and a contact portion provided on a second surface of the package substrate that is opposite to the first surface in a first direction perpendicular to the first surface, and a plurality of terminals adjacent to the base in a second direction parallel to the first surface;
a semiconductor chip including a first pad to which a ground voltage is supplied, a second pad electrically connected to a first terminal among the plurality of terminals, and a semiconductor circuit connected to the first and second pads, the semiconductor chip being provided above the mount portion; and
a first capacitor chip including a first capacitor unit provided on a first silicon substrate, a first node electrically connected to the first capacitor unit and supplied with the ground voltage, and a second node electrically connected to the second pad and the first capacitor unit, the first capacitor chip being provided above the mount portion,
wherein
the semiconductor chip further includes
a third surface on which the first and second pads are provided,
a fourth surface opposite to the third surface in the first direction,
a first electrode extending from the third surface to the fourth surface and electrically connected to the first pad,
a third pad provided on the third surface,
a second electrode extending from the third surface to the fourth surface and electrically connected to the third pad, and
a conductive layer provided between the fourth surface and the base and electrically connected to the first and second electrodes, and
the first node is electrically connected to the third pad via a first wire.

2. The semiconductor device according to claim 1, wherein
the first pad is electrically connected to the base via the conductive layer, and
the ground voltage is supplied to the base via the contact portion.

3. The semiconductor device according to claim 1, wherein
the first pad is electrically connected to a second terminal among the plurality of terminals via a second wire, to which the ground voltage is supplied.

4. The semiconductor device according to claim 1, wherein the first capacitor chip is a passive element.

5. A semiconductor device comprising:
a package substrate including a base including a mount portion provided on a first surface of the package substrate and a contact portion provided on a second surface of the package substrate that is opposite to the first surface in a first direction perpendicular to the first surface, and a plurality of terminals adjacent to the base in a second direction parallel to the first surface;
a semiconductor chip including a first pad to which a ground voltage is supplied, a second pad electrically connected to a first terminal among the plurality of terminals, and a semiconductor circuit connected to the first and second pads, the semiconductor chip being provided above the mount portion; and
a first capacitor chip including a capacitor unit provided on a silicon substrate, a first node electrically connected to the first pad and the capacitor unit, and a second node electrically connected to the second pad and the capacitor unit, the first capacitor chip being provided on the semiconductor chip in the first direction, wherein
the semiconductor chip further includes
a third surface on which the first and second pads are provided,
a fourth surface opposite to the third surface in the first direction,
a first electrode extending from the third surface to the fourth surface and electrically connected to the first pad, and
a conductive layer provided between the fourth surface and the base and electrically connected to the first electrode.

6. The semiconductor device according to claim 5, wherein
the first and second nodes are electrically connected to the first and second pads, respectively, by a plurality of stacked bumps.

7. The semiconductor device according to claim 5, wherein
the first and second nodes are electrically connected to the first and second pads, respectively, by a conductive sheet.

8. The semiconductor device according to claim 5, wherein the ground voltage is supplied to the first electrode via the base.

9. The semiconductor device according to claim 5, wherein the first capacitor chip is a passive element.

10. A semiconductor device comprising:
a package substrate including a base including a mount portion provided on a first surface of the package substrate and a contact portion provided on a second surface of the package substrate that is opposite to the first surface in a first direction perpendicular to the first surface, and a plurality of terminals adjacent to the base in a second direction parallel to the first surface;
a semiconductor chip including a first pad to which a ground voltage is supplied, a second pad electrically connected to a first terminal among the plurality of terminals, and a semiconductor circuit connected to the first and second pads, the semiconductor chip being provided above the mount portion;
a first capacitor chip including a first capacitor unit provided on a first silicon substrate, a first node electrically connected to the first capacitor unit and supplied with the ground voltage, and a second node electrically connected to the second pad and the first capacitor unit, the first capacitor chip being provided above the mount portion; and
a second capacitor chip including a second capacitor unit provided on a second silicon substrate, a third node electrically connected to the second capacitor unit and supplied with the ground voltage, and a fourth node electrically connected to the second pad and the second capacitor unit, the second capacitor chip being provided above the mount portion, wherein
an interval between the second capacitor chip and the semiconductor chip is equal to an interval between the first capacitor chip and the semiconductor chip, and
a length of a signal path between the fourth node and the second pad is equal to a length of a signal path between the second node and the second pad.

* * * * *